United States Patent [19]

Hosokawa

[11] Patent Number: 5,737,341

[45] Date of Patent: Apr. 7, 1998

[54] METHOD OF GENERATING TEST SEQUENCE AND APPARATUS FOR GENERATING TEST SEQUENCE

[75] Inventor: Toshinori Hosokawa, Osaka, Japan

[73] Assignee: Matsushita Electric Industrial Co., Ltd., Osaka, Japan

[21] Appl. No.: 758,835

[22] Filed: Dec. 4, 1996

Related U.S. Application Data

[63] Continuation of Ser. No. 268,322, Jun. 30, 1994, abandoned.

[30] Foreign Application Priority Data

Jul. 1, 1993 [JP] Japan ............................ 5-163406

[51] Int. Cl.$^6$ .................................................. G01R 31/28
[52] U.S. Cl. ........................................ 371/22.31; 371/27.1
[58] Field of Search ............................ 371/22.31, 22.32, 371/22.33, 22.36, 27.1, 27.2; 364/488, 490; 395/421.07, 183.01

[56] References Cited

U.S. PATENT DOCUMENTS

| | | | |
|---|---|---|---|
| 5,043,986 | 8/1991 | Agrawal et al. | 371/25.1 |
| 5,132,974 | 7/1992 | Rosales | 371/22.3 |
| 5,257,268 | 10/1993 | Agrawal et al. | 371/27 |
| 5,305,328 | 4/1994 | Motohara et al. | 371/27 |
| 5,319,647 | 6/1994 | Hosokawa et al. | 371/27 |
| 5,430,736 | 7/1995 | Takeoka et al. | 371/23 |

OTHER PUBLICATIONS

V. Chickermane and J.H. Patel, A Fault Oriented Partial Scan Approach 1991, International Conference on computer–Aided Design.

IEEE Paper:Essential: An efficient Self–learning test pattern generation; 1989.

IEEE Paper: A Partial Scan method for Sequential circuits with feedback; 1990.

Primary Examiner—Phung Chung
Assistant Examiner—Nadeem Iqbal
Attorney, Agent, or Firm—McDermott, Will & Emery

[57] ABSTRACT

In a method of generating a test sequence for testing a stuck-at fault supposed in a sequential circuit as a test circuit, the number of flip-flops which can be replaced with scan flip-flops among flip-flops included in the circuit under test is initially specified in the first step. Next, in the second step, there is calculated, for each of the flip-flops included in the circuit under test, the sequential depth of a clock defined as the minimum number of flip-flops that are passed through while the input side from the clock input terminal of the flip-flop is traced until an external input pin is reached. In the third step, flip-flops are identified with scan flip-flops by the number specified in the first step in the order of decreasing sequential depth of a clock, which was calculated in the second step.

9 Claims, 17 Drawing Sheets

SEQUENTIAL CIRCUIT 1

SEQUENTIAL CIRCUIT 2

SEQUENTIAL CIRCUIT

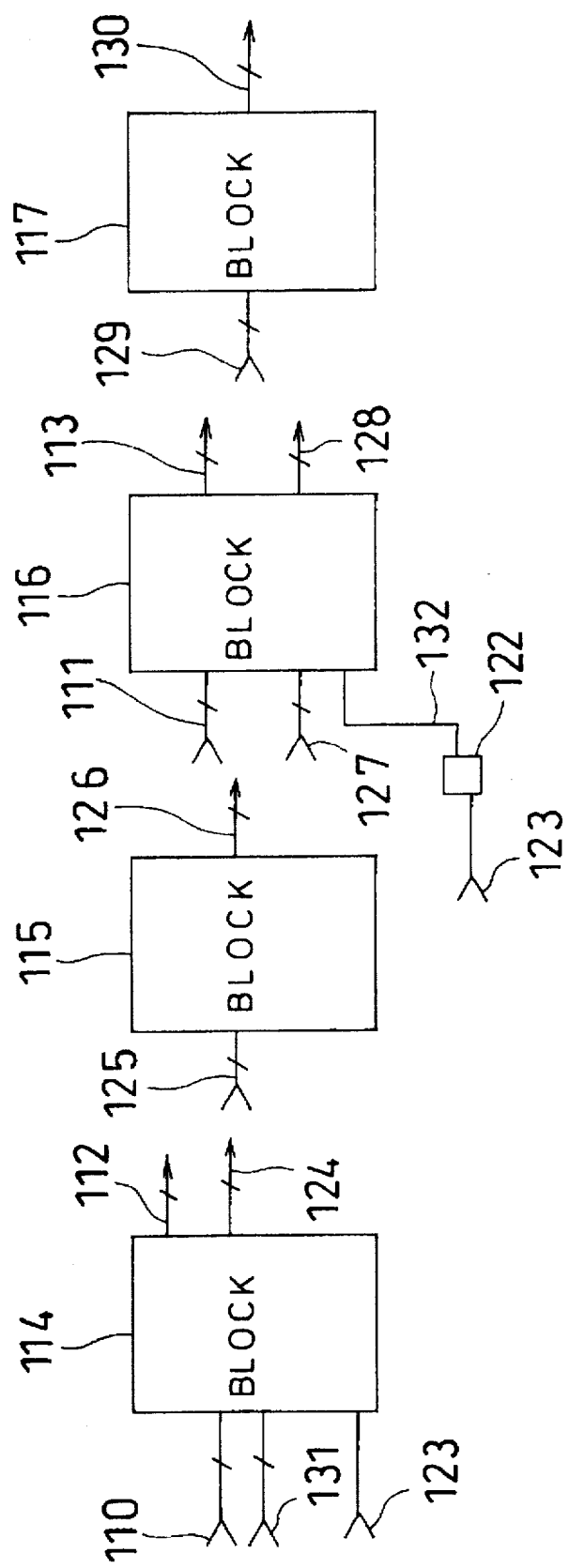

SEQUENTIAL CIRCUIT

SENDING FF'S---FOUR

RECEIVING FF'S---FOUR

SCAN CHAIN

TEST ON BLOCK 146

METHOD OF GENERATING TEST SEQUENCE AND APPARATUS FOR GENERATING TEST SEQUENCE

This is a continuation application of application Ser. No. 08/268,322 filed Jun. 30, 1994, now abandoned.

BACKGROUND OF THE INVENTION

The present invention relates to a method and apparatus for generating a test sequence for a digital circuit.

As a conventional method of generating a test sequence, especially as a method of identifying a flip-flop with a scan flip-flop (herein after referred to as a scan FF), there is known a method of selecting, by focusing attention on circuits for supplying signals to the data input terminals of flip-flops, a sequential circuit, in which a large number of loops exists, from the above circuits for supplying signals so that the flip-flop corresponding to the selected circuit is replaced by a scan FF. The above method is disclosed in the papers and references of the 1991 International Conference on Computer-Aided Design [V. Chickermane and J. H. Patel, "A Fault Oriented Partial Scan Approach"].

However, the conventional method of generating a test sequence as described above has the following disadvantages (1) There actually is a case in which, among the circuits for supplying signals to the flip-flops in a circuit under test, a circuit having difficulty in automatically generating a rise signal (or a fall signal) to be supplied to the clock input terminal of it's corresponding flip-flop, although it contains no loop. In this case, the conventional replacement with a scan FF that focuses attention on the circuit for supplying a signal to the data input terminal cannot improve a fault coverage in generating a test sequence; and (2) In the case where data transfer is performed between flip-flops operated by individual clock input signals with different frequencies, which are obtained from the same clock signal supplied to the same clock pin, it is necessary to treat a plurality of time frames as a single time frame, so that it is difficult to generate a test sequence.

SUMMARY OF THE INVENTION

The present invention has been achieved in view of the foregoing. It is therefore an object of the present invention to provide a method and apparatus for generating a test sequence whereby a high fault coverage can be obtained through efficient replacement with a scan FF.

To attain the above object, a method of generating a test sequence for testing a stuck-at fault supposed in a sequential circuit as a circuit under test comprises: a first step of specifying, among registers included in said circuit under test, the number of registers which can be replaced with scan registers; a second step of calculating the sequential depth of a clock for each of the registers included in said circuit under test, said sequential depth of a clock being defined as the minimum number of registers that are passed through while said circuit under test is traced from the clock input terminal of said register to its input side until an external input pin is reached; and a third step of identifying registers with scan registers by the number specified in said first step in the order of decreasing sequential depth of a clock calculated in said second step.

A second method of generating a test sequence according to the present invention is composed of the above first method of generating a test sequence, in which the above third step has: a fourth step of selecting, from the registers included in said circuit under test, a register having the largest sequential depth of a clock calculated in said second step and identifying the selected register with a scan register; and a fifth step of recognizing the output signal line and input signal line of the register identified with a scan register in said fourth step as the external input pin and an external output pin, respectively, said fourth and fifth steps being repeatedly performed so that another register can be selected in said fourth step from the registers included in the circuit under test, exclusive of the register identified with a scan register, until the number of the registers identified with scan registers reaches the number specified in said first step.

A third method of generating a test sequence for testing a stuck-at fault supposed in the sequential circuit as the circuit under test further comprises: a first step of specifying, among registers included in said circuit under test, the number of registers which can be replaced with scan registers; a second step of calculating the controllability of a clock input signal line for each of the registers included in said circuit under test, said controllability of a clock input signal line being defined as cost required for setting a desired value to a signal line connected to the clock input terminal of said register; and a third step of identifying registers with scan registers by the number specified in said first step in the order of decreasing controllability of a clock input signal line calculated in said second step.

A fourth method of generating a test sequence according to the present invention is composed of the above third method of generating a test sequence, in which the above third step has: a fourth step of selecting, among the registers included in said circuit under test, a register having the largest controllability of a clock input signal line calculated in said second step and identifying the selected register with a scan register; a fifth step of recognizing the output signal line and input signal line of the register identified with a scan register in said fourth step as an external input pin and external output pin, respectively, said fourth and fifth steps being repeatedly performed so that another register can be selected in said fourth step from the registers included in the circuit under test, exclusive of the register identified with a scan register, until the number of registers identified with scan registers reaches the number specified in said first step.

With the structure of the above first, second, third, or fourth method of generating a test sequence, if the circuit under test is an asynchronous circuit in which the clock circuit of a register is composed of a sequential circuit, a register for which it is difficult to generate a rise signal (or a fall signal) to be supplied to its clock input terminal is selected in performing replacement with a scan register. Consequently, it becomes possible to generate a test sequence by regarding the circuit under test as a synchronous circuit, so that a test sequence which provides a high fault coverage can be generated at a high speed.

To attain the above object, a fifth method of generating a test sequence for testing a stuck-at fault supposed in a sequential circuit as a circuit under test according to the present invention comprises: a first step of judging whether or not a frequency divider exists in said circuit under test; a second step of classifying, if it is judged in said first step that a frequency divider exists in said circuit under test, the registers included in said circuit under test by the frequencies of clock input signals for operating the individual registers; and a third step of identifying registers, which are operated by the individual clock input signals with different frequencies and which transfer data therebetween, with scan registers.

A sixth method of generating a test sequence according to the present invention is composed of the above fifth method of generating a test sequence, in which the above third step has: a fourth step of judging whether or not it has been judged on each of the registers included in said circuit under test that it should or should not be replaced with a scan register; a fifth step of selecting, if it is judged in said fourth step that there are registers on which it has not yet been judged whether or not they should be replaced with scan registers, a register on which it will be judged whether or not it should be replaced with a scan register from the registers on which judgments have not yet been made; a sixth step of judging whether or not the register selected in said fifth step receives data from or sends data to another register operated by the clock input signal with a different frequency; a seventh step of identifying, if it is judged in said sixth step that said register receives data from or sends data to another register operated by the clock input signal with a different frequency, said register with a scan register; and an eighth step of recognizing the output signal line and input signal line of the register identified with a scan register in said seventh step as an external input pin and external output pin.

With the structure of the above fifth or sixth method of generating a test sequence, the registers which are operated by the clock input signals with different frequencies and which transfer data therebetween are selected to be replaced with scan registers. As a result, the circuit under test is divided into a combinational circuit, a complete synchronous circuit, and an asynchronous circuit so that an independent test sequence can be generated for each circuit, which greatly facilitates the generation of the test sequences. Consequently, test sequences which provide a high fault coverage can be generated at a high speed.

A seventh method of generating a test sequence according to the present invention is composed of the above sixth method of generating a test sequence which further comprises: a ninth step of judging whether or not each of the registers identified with scan registers in said third step performs either the receiving of data from or sending of data to another register operated by the clock input signal with a different frequency and whether or not the number of registers on the sending side which send data to another register operated by the clock input signal with a different frequency is equal to or larger than the number of registers on the receiving side which receive data from another register operated by the clock input signal with a different frequency; a tenth step of recognizing, if it is judged in said ninth step that each register performs either said receiving of data or said sending of data and that the number of said registers on the sending side is equal to or larger than the number of said registers on the receiving side, a scan chain which is obtained by sequentially linking the registers on the sending side first and, after the linkage of all the registers on the sending side is completed, liking the registers on the receiving side; an eleventh step of recognizing, in said circuit under test, a circuit part surrounded by the registers on the sending side and by the registers on the receiving side; a twelfth step of judging whether or not an objective fault is a fault in the circuit part recognized in said eleventh step; a thirteenth step of judging, if it is judged in said twelfth step that the objective fault is a fault in said circuit part, whether or not there are undetected and unprocessed faults for which test sequences have not yet been generated in said circuit part; and a fourteenth step of selecting, if it is judged in said thirteenth step that there are undetected and unprocessed faults in said circuit part, another objective fault from the undetected and unprocessed faults in said circuit part.

An eighth method of generating a test sequence according to the present invention is composed of the above fifth method of generating a test sequence which further comprises: a fourth step of judging whether or not each of the registers identified with scan registers in said third step performs either the receiving of data from or sending of data to another register operated by the clock input signal with a different frequency and whether or not the number of registers on the sending side which send data to another register operated by the clock input signal with a different frequency is equal to or larger than the number of registers on the receiving side which receive data from another register operated by the clock input signal with a different frequency; a fifth step of recognizing, if it is judged in said fourth step that each register performs either said receiving of data or said sending of data and that the number of said registers on the sending side is equal to or larger than the number of said registers on the receiving side, a scan chain which is obtained by sequentially linking the registers on the sending side first and, after the linkage of all the registers on the sending side is completed, liking the registers on the receiving side; a sixth step of recognizing, in said circuit under test, a circuit part surrounded by the registers on the sending side and by the registers on the receiving side; a seventh step of judging whether or not an objective fault is a fault in the circuit part recognized in said sixth step; an eighth step of judging, if it is judged in said seventh step that the objective fault is a fault in said circuit part, whether or not there are undetected and unprocessed faults for which test sequences have not yet been generated in said circuit part; and a ninth step of selecting, if it is judged in said eighth step that there are undetected and unprocessed faults in said circuit part, another objective fault from the undetected and unprocessed faults in said circuit part.

With the structure of the above seventh or eighth method of generating a test sequence, if the data transfer is unidirectional, the operations of scanning in and scanning out can be performed with a shorter test pattern by recognizing the scan chain as obtained by linking the registers on the sending side first and, after completing the linkage of all the registers on the sending side, linking the registers on the receiving side. Consequently, in selecting an objective fault for performing the generation of a test sequence, the generation of a test sequence can be performed at an extremely high speed by sequentially selecting faults in the part surrounded by the scan chain as objective faults.

To attain the above object, a first apparatus for generating a test sequence for testing a stuck-at fault supposed in a sequential circuit as a circuit under test according to the present invention comprises: a first means for storing the number of registers which can be replaced with scan registers among the registers included in said circuit under test; a second means for calculating the sequential depth of a clock for each of the registers included in said circuit under test, said sequential depth of a clock being defined as the minimum number of registers that are passed through while said circuit under test is traced from the clock input terminal of said register to its input side until an external input pin is reached; and a third means for selecting a register having the largest sequential depth calculated by said second means from the registers included in said circuit under test and identifying the selected register with a scan register; a fourth means for recognizing the output signal line and input signal line of the register identified with a scan register by said third means as the external input pin and an external output pin, respectively, said third and fourth means being repeatedly operated so that another register can be selected by said third means from the registers included in the circuit under test, exclusive of the register identified with a scan register by said third means, until the number of registers identified with scan registers reaches the number stored in said first means.

A second apparatus for generating a test sequence for testing a stuck-at fault supposed in a sequential circuit serving a circuit under test according to the present invention comprises: a first means for storing the number of registers which can be replaced with scan registers among the registers included in said circuit under test; a second means for calculating the controllability of a clock input signal line for each of the registers included in said circuit under test, said controllability of a clock input signal line being defined as cost required for setting a specified value to a signal line connected to the clock input terminal of the register; a third means for selecting, from the registers included in said circuit under test, a register having the largest controllability of a clock input signal line calculated by said second means and identifying said register with a scan register; and a fourth means for recognizing the output signal line and input signal line of said register identified with a scan register by said third means as an external input pin and external output pin, respectively, said third and fourth means being repeatedly operated so that another register can be selected by said third means from the registers included in the circuit under test, exclusive of the register identified with a scan register by said third means, until the number of the registers identified with scan registers reaches the number stored by said first means.

With the structure of the above first or second apparatus for generating a test sequence, if the circuit under test is an asynchronous circuit in which the clock circuit of a register is composed of a sequential circuit, a register for which it is difficult to generate a rise signal (or a fall signal) to be supplied to its clock input terminal is selected in performing replacement with a scan register. Consequently, a test sequence can be generated by regarding the circuit under test as a synchronous circuit, so that a test sequence which provides a high fault coverage can be generated at a high speed.

A third apparatus for generating a test sequence for testing a stuck-at fault supposed in a sequential circuit as a circuit under test according to the present invention comprises: a first means for judging whether or not a frequency divider exists in said circuit under test; a second means for classifying, if it is judged that a frequency divider exists in said circuit under test, the registers included in said circuit under test by the frequencies of clock input signals for operating the individual registers; a third means for judging whether or not it has been judged on each of the registers included in said circuit under test that it should or should not be replaced with a scan register; a fourth means for selecting, if it is judged by said third means that there are registers on which it has not yet been judged whether or not they should be replaced with scan registers, a register on which it will be judged that it should or should not be replaced with a scan register from the registers on which judgements have not yet been made; a fifth means for judging whether or not the register selected by said fourth means receives data from or sends data to another register operated by the clock input signal with a different frequency; a sixth means for identifying, if it is judged that said register receives data from or sends data to another register operated by the clock input signal with a different frequency, said register with a scan register; and a seventh means for recognizing the output signal line and input signal line of the register identified with a scan register as an external input pin and external output pin, respectively.

With the structure of the above third apparatus for generating a test sequence, registers which are operated by clock input signals with different frequencies and which transfer data therebetween are selected to be replaced with scan registers. As a result, the circuit under test is divided into a combinational circuit, a complete synchronous circuit, and an asynchronous circuit so that an independent test sequence can be generated for each circuit, which greatly facilitates the generation of the test sequences. Consequently, test sequences which provide a high fault coverage can be generated at a high speed.

A fourth apparatus for generating a test sequence according to the present invention is composed of the above third apparatus for generating a test sequence which further comprises: an eighth means for judging, whether or not each of the registers identified with scan registers by said sixth means performs either the receiving of data from or sending of data to another register operated by the clock input signal with a different frequency and whether or not the number of the registers on the sending side which send data to another register operated by the clock input signal with a different frequency is equal to or larger than the number of the registers on the receiving side which receive data from another register operated by the clock input signal with a different frequency; a ninth means for recognizing, if it is judged by said eighth means that each register performs either said receiving of data or said sending of data and that the number of the registers on the sending side which send data to another register operated by the clock input signal with a different frequency is equal to or larger than the registers on the receiving side which receive data to another register operated by the clock input signal with a different frequency, a scan chain which is obtained by sequentially linking the registers on the sending side first and, after the linkage of all the registers on the sending side is completed, linking the registers on the receiving side; a tenth means for recognizing, in said circuit under test, a circuit part surrounded by said registers on the sending side and by the registers on the receiving side: an eleventh means for judging whether or not an objective fault is a fault in the circuit part recognized by said tenth means; a twelfth means for judging, if it is judged by said eleventh means that the objective fault is a fault in said circuit part, whether or not there are undetected and unprocessed faults for which test sequences have not yet been generated; and a thirteenth means for selecting, if it is judged by said twelfth means that there are undetected and unprocessed faults in said circuit part, another objective fault from the undetected and unprocessed faults in said circuit part.

With the structure of the above fourth apparatus for generating a test sequence, if the data transfer is unidirectional, the operations of scanning in and scanning out can be performed with a shorter test pattern by recognizing the scan chain as one obtained by linking the registers on the sending side first and, after completing the linkage of all the registers on the sending side, linking the registers on the receiving side. Consequently, in selecting an objective fault for performing the generation of a test sequence, the generation of the test sequence can be performed at an extremely high speed by sequentially selecting faults in the part surrounded by the scan chain as objective faults.

Thus, through efficient replacement with a scan FF, the present invention can overcome the disadvantages of the conventional method of generating a test sequence for a sequential circuit that: (1) There actually is a case in which, among the circuits for supplying signals to the flip-flops in a circuit under test, a circuit having difficulty in automatically generating a rise signal (or a fall signal) to be supplied to the clock input terminal of its corresponding flip-flop, although it contains no loop. In this case, the conventional replacement with a scan FF that focuses attention on the circuit for supplying a signal to the data input terminal cannot improve a fault coverage in the generation of a test sequence; and (2) In the case where data transfer is performed between flip-flops operated by individual clock input signals with different frequencies which are obtained from the same clock signal supplied to the same clock pin, it is necessary to treat a plurality of time frames as a single time frame, so that it is difficult to generate a test sequence. Accordingly, the present invention can provide the method and apparatus for generating a test sequence whereby a higher fault coverage can be obtained through efficient replacement with a scan FF.

BRIEF DESCRIPTION OF THE DRAWINGS

FIG. 14(b) is a block diagram showing the circuit under test of FIG. 14(a) that has under gone the step of identifying a flip-flop with a scan FF;

DETAILED DESCRIPTION OF THE DRAWINGS

Figure 1:
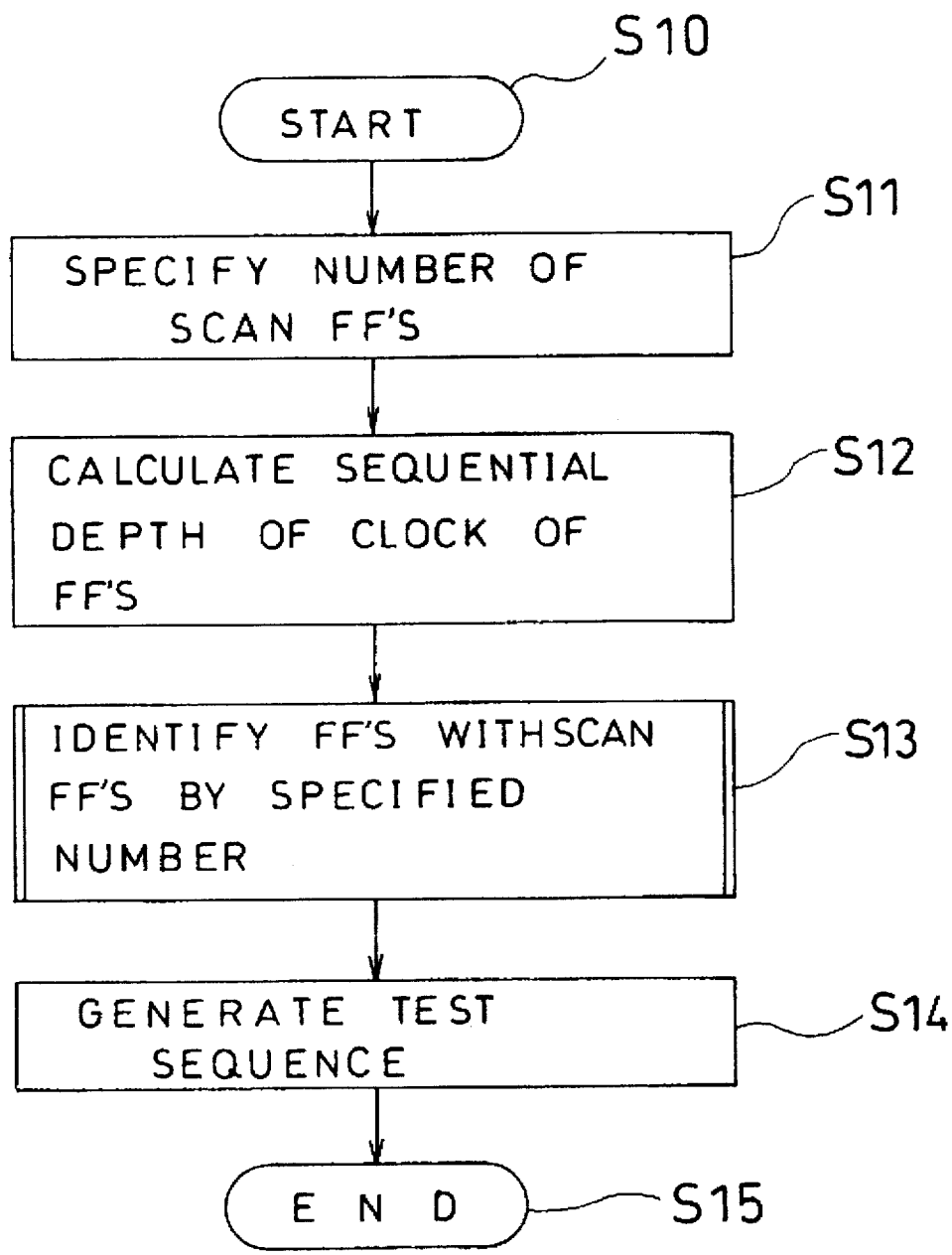
FIG. 1 is a flow chart showing a method of generating a test sequence according to a first embodiment of the present invention.

Referring now to the drawings, the embodiments of the present invention will be described below.
(First Embodiment)

FIG. 1 is a flow chart showing a method of generating a test sequence for a sequential circuit according to a first embodiment of the present invention.

In FIG. 1, Step S10 designates the initiation of a step of generating a test sequence for a sequential circuit and Step S15 designates the completion of the step of generating a test sequence.

First, in Step S11, the number of flip-flops which can be replaced with scan FFs among the flip-flops included in a sequential circuit is specified.

Next, in Step S12, the sequential circuit is traced from the clock input terminal of each flip-flop to its input side, so as to calculate the minimum number of flip-flops that will have been passed through until a given external input pin is reached. However, if a flip-flop is reached as a result of the tracing, the sequential circuit is traced from the clock input terminal of each flip-flop only to its input side. In other words, the sequential depth of a clock in the flip-flop is calculated.

Next, in Step S13, flip-flops are identified with scan FFs by the number specified in Step S11 in the order of decreasing sequential depth of a clock, which was calculated in Step S12.

Figure 2:
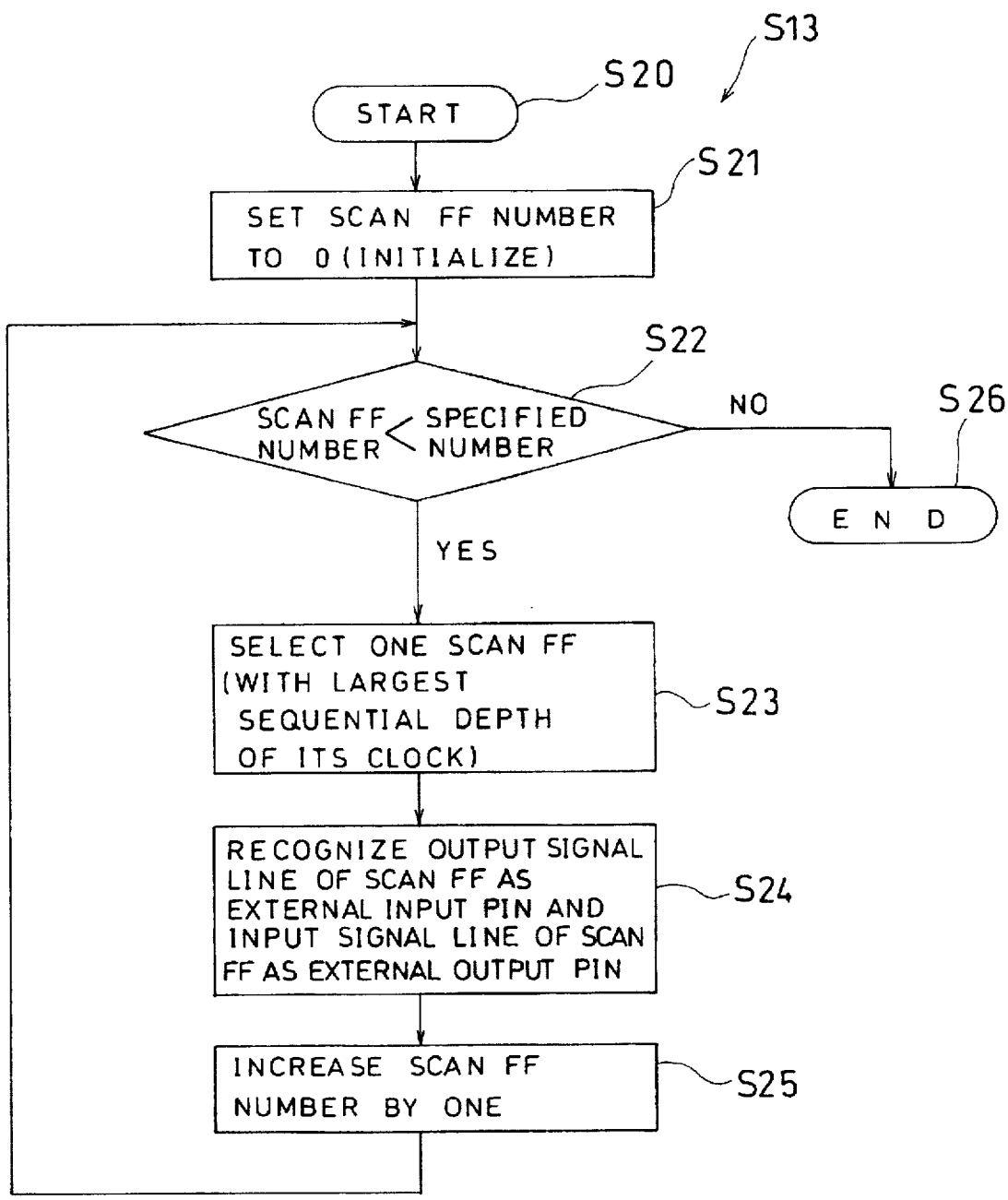
FIG. 2 is a flow chart showing in detail a step of identifying a flip-flop with a scan FF of the method of generating a test sequence according to the first embodiment.

FIG. 2 is a flow chart showing in detail the step of identifying flip-flops with scan FFs in Step S13. In FIG. 2, Step S20 designates the initiation of the step of identifying flip-flops with scan FFs and Step S26 designates the completion of the step of identifying flip-flops with scan FFs. First, in Step S21, the scan FF number is initialized. Next, in Step S22, it is judged whether or not the scan FF number is smaller than the number specified in Step S11. If it is judged that the scan FF number is smaller than the number specified in Step S11, the process goes on to Step S23, where a flip-flop having the largest sequential depth of a clock is selected from the flip-flops included in the sequential circuit and the selected flip-flop is identified with a scan FF. Next, in Step S24, the output signal line and input signal line of the flip-flop identified with a scan FF in Step S23 are recognized as an external input pin and external output pin, respectively. After increasing the scan FF number by one in Step S25, the process goes on to Step S22, where Steps S22 to S25 are repeatedly executed until it is judged that the scan FF number is equal to or larger than the number specified in Step S11. In this case, the flip-flop identified with a scan FF in Step S23 is excluded from options from which another flip-flop will be selected in the subsequent Step S23. If it is judged in Step S22 that the scan FF number is equal to or larger than the number specified in Step S11, the process goes on to Step S26, where the step of identifying flip-flops with scan FFs is completed.

When the step of identifying flip-flops with scan FFs of Step S13 is completed, the generation of a test sequence is performed by regarding the output signal lines and input signal lines of the flip-flops identified with scan FFs in Step S13 as external input pins and external output pins, respectively.

(Second Embodiment)

Figure 3:
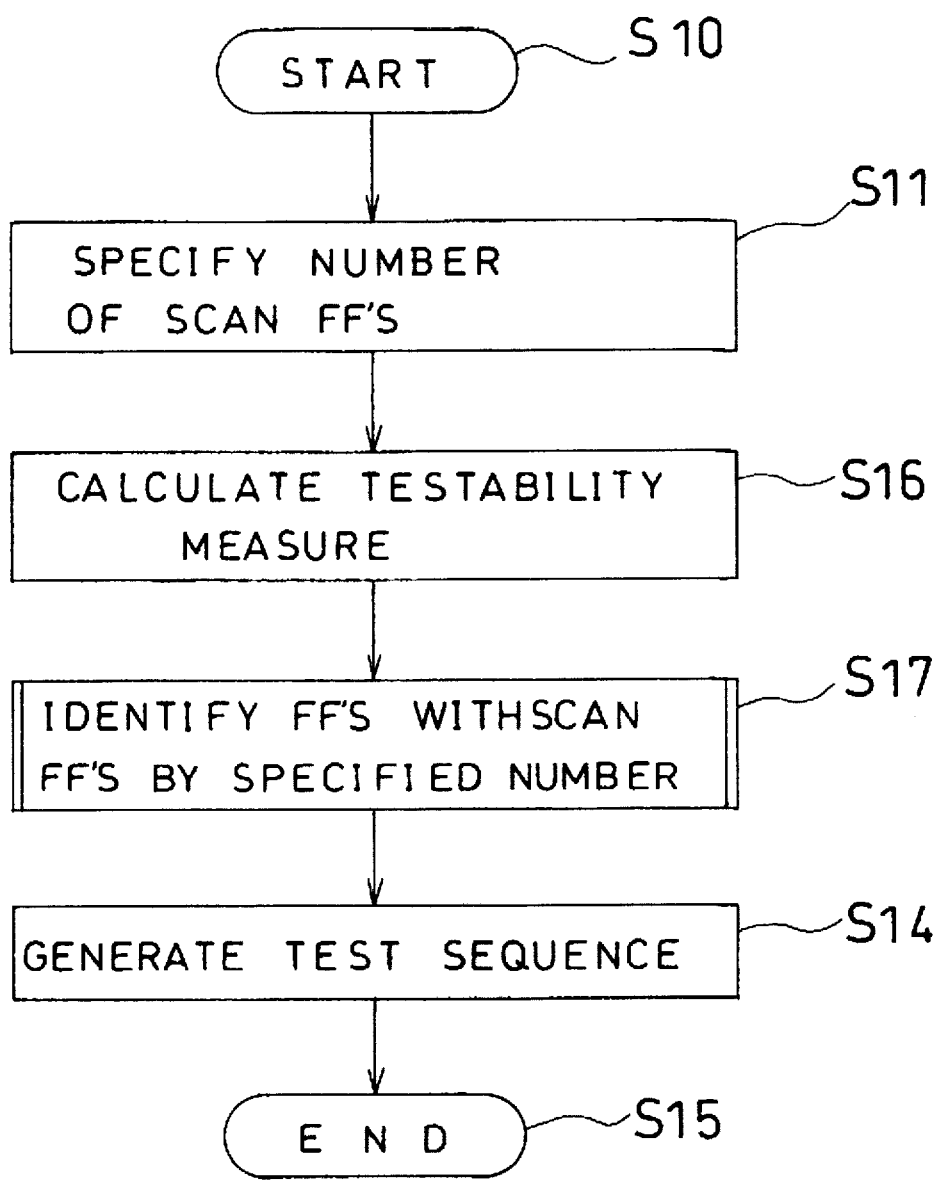
FIG. 3 is a flow chart showing the method of generating a test sequence according to a second embodiment of the present invention.

FIG. 3 is a flow chart showing the method of generating a test sequence for a sequential circuit according to a second embodiment of the present invention. The method of generating a test sequence according to the second embodiment was obtained by replacing the step of calculating the sequential depth of a clock (Step S12) of the method of generating a test sequence according to the first embodiment shown in FIG. 1 with a step of calculating a testability measure (Step S17) and partially modifying the step of identifying flip-flops with scan FFs, accordingly.

In FIG. 3, Step S10 designates the initiation of the step of generating a test sequence for a sequential circuit and Step S15 designates the completion of the step of generating a test sequence.

First, in Step S11, the number of flip-flops which can be replaced with scan FFs among the flip-flops included in the sequential circuit is specified.

Next, in Step S16, there is calculated a testability measure of the whole sequential circuit in consideration of the operation of a sequential element. Specifically, there are calculated: observability defined as cost required for observing the value of a signal line; and controllability defined as cost required for setting a desired value to the signal line. The controllability can be subdivided into: 0 controllability in the case of setting a logic value 0 to the signal line; and 1 controllability in the case of setting a logic value 1 to the signal line.

Next, in Step S17, flip-flops are identified with scan FFs by the number specified in Step S11 in the order of decreasing controllability of a clock input signal line, which was calculated in Step S16. Here, the controllability of a clock input signal line indicates the sum of the 0 controllability and 1 controllability in relation to a signal line connected to the clock input terminal of a flip-flop.

Figure 4:
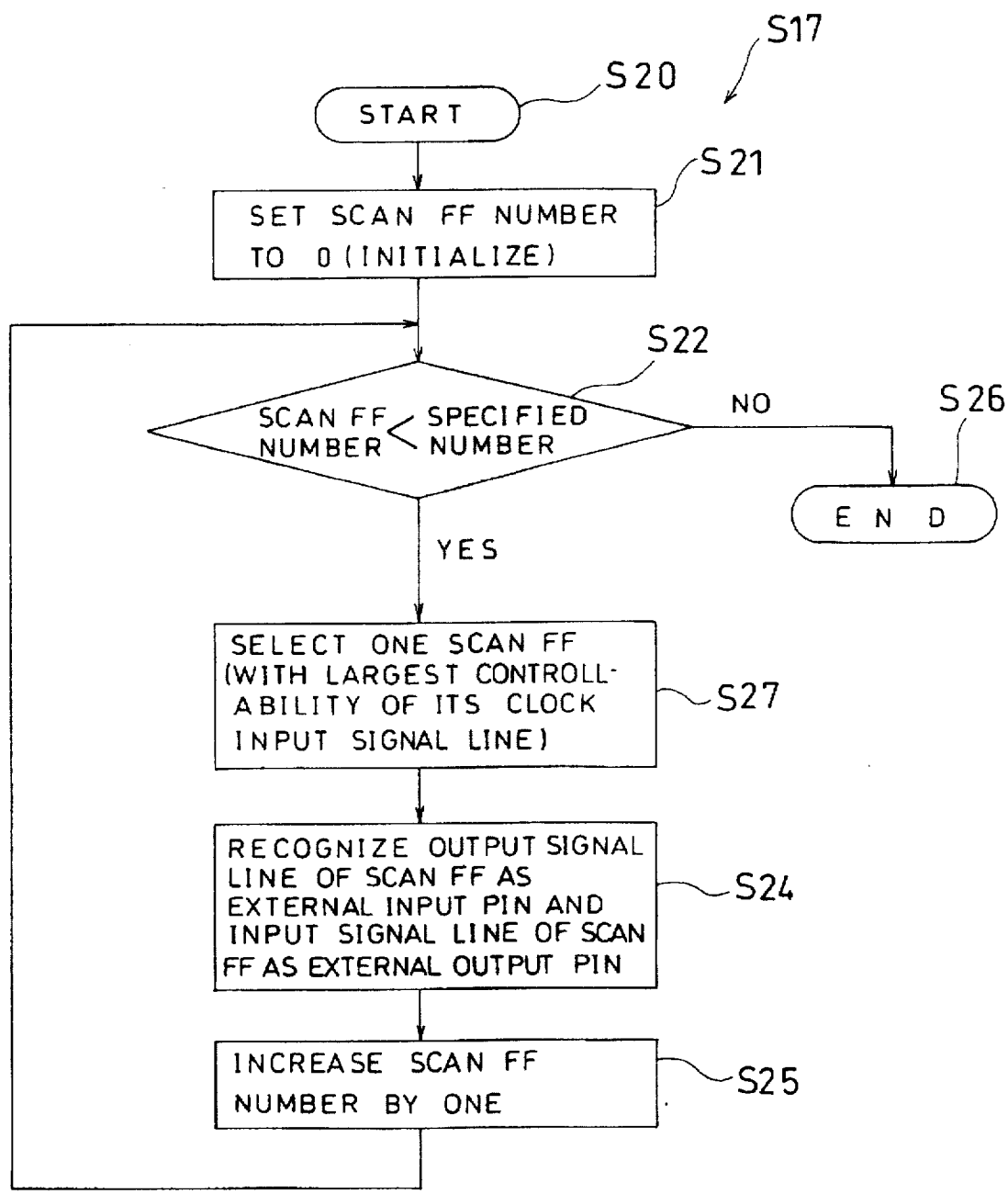
FIG. 4 is a flow chart showing in detail the step of identifying a flip-flop with a scan FF of the method of generating a test sequence according to the second embodiment.

FIG. 4 is a flow chart showing in detail the step of identifying flip-flops with scan FFs of Step S17. Step S17 was obtained by replacing the scan FF selecting step of selecting a flip-flop having the largest sequential depth of a clock (Step S23) of Step S13 with a scan FF selecting step of selecting a flip-flop having the largest controllability of a clock input signal line as a scan FF (Step S27). In FIG. 4, Step S20 designates the initiation of the step of identifying flip-flops with scan FFs and Step S26 designates the completion of the step of identifying flip-flops with scan FFs. First, in Step S21, the scan FF number is initialized. Next, in Step S22, it is judged whether or not the scan FF number is smaller than the number specified in Step S11. If it is judged that the scan FF number is smaller than the number specified in Step S11, the process goes on to Step S27, where a flip-flop having the largest controllability of a clock input signal line is selected from the flip-flops included in the sequential circuit and the selected flip-flop is identified with a scan FF. Next, in Step S24, the output signal line and input signal line of the flip-flop identified with a scan FF in Step S27 are recognized as an external input pin and external output pin, respectively. After increasing the scan FF number by one in Step S25, the process returns to Step S22, where Steps S22, S27, S24, and S25 are repeatedly executed until it is judged that the scan FF number is equal to or larger than the number specified in Step S11. In this case, the flip-flop identified with a scan FF in Step S27 is excluded from options from which another flip-flop will be selected in the subsequent Step S27. If it is judged in Step S22 that the scan FF number is equal to or larger than the number specified in Step S11, the process goes on to Step S26, where the step of identifying flip-flops with scan FFs is completed.

When the step of identifying flip-flops with scan FFs of Step S17 is completed, the generation of a test sequence is performed in Step S14 by regarding the output signal lines and input signal lines of the flip-flops identified with scan FFs in Step S17 as external input pins and external output pins, respectively.

Figure 5:
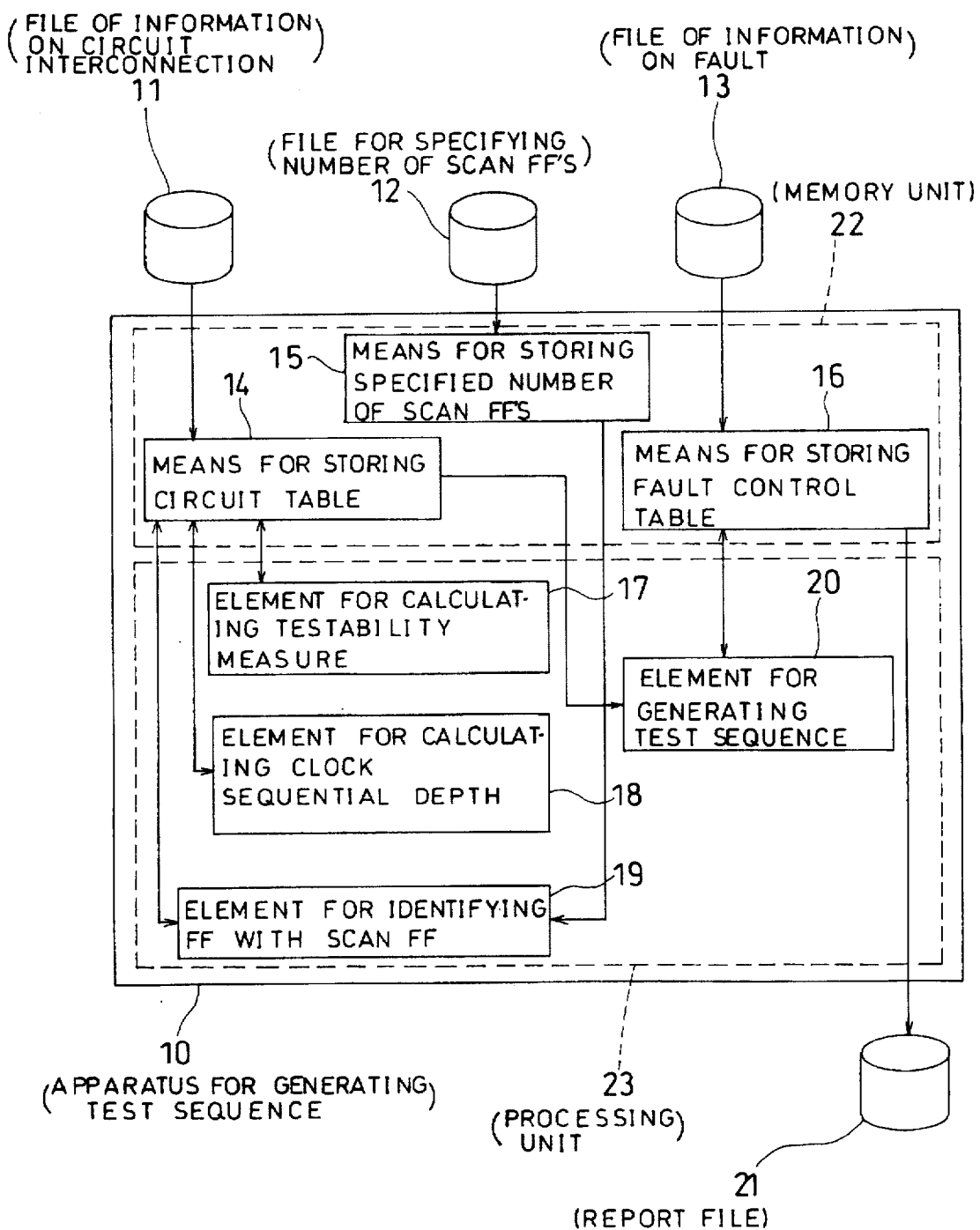
FIG. 5 is a block diagram showing the structure of an apparatus for generating a test sequence which implements the method of generating a test sequence according to the first and second embodiments.

FIG. 5 is a block diagram showing the structure of an apparatus for generating a test sequence for a sequential circuit which implements the method of generating a test sequence according to the above first and second embodiments.

In FIG. 5, a reference numeral 10 designates the whole apparatus for generating a test sequence, 11 designates a file of information on circuit interconnection, 12 designates a file for specifying the scan FF number which specifies the number of flip-flops which can be replaced with scan FFs, and 13 designates a file of information on fault, in which faults are defined. The fault to be subjected to a test here is a fault supposed and modeled based on the circuit under test and, more specifically, a stuck-at fault in which a signal line of the circuit is fixed to a logic value 0 or 1. The degenerations fault can be: a 0 stuck-at fault in which a signal line of the circuit is fixed to a logic value 0; and a 1 stuck-at fault in which a signal line of the circuit is fixed to a logic value 1. A reference numeral 14 designates a means for storing a circuit table which reads in the file 11 of information on circuit interconnection as an input and stores a circuit table indicating information on the interconnection of a circuit, 15 designates a means for storing the specified number of scan FFs which reads in the file 12 for specifying the scan FF number as an input and stores the number of flip-flops which can be replaced with scan FFs, and 16 designates a means for storing a fault control table which reads in the file 13 of information on fault as an input and stores a fault control table as shown in Table 1.

TABLE 1

FAULT CONTROL TABLE

| SIGNAL LINE | FAULT | DETECTED | PROCESSED | REDUNDANT FAULT |
|---|---|---|---|---|
| a | s-a-0 | 1 | 1 | 0 |
| a | s-a-1 | 0 | 1 | 1 |
| b | s-a-0 | 1 | 1 | 0 |
| b | s-a-1 | 1 | 1 | 0 |
| c | s-a-0 | 0 | 1 | 0 |
| c | s-a-1 | 0 | 0 | 0 |
| . | | | | |
| . | | | | |
| . | | | | |
| . | | | | |

In Table 1, "SIGNAL LINE" indicates a signal line present in the circuit under test, "FAULT" indicates the 0 stuck-at fault (s-a-0) or 1 stuck-at fault (s-a-1), "DETECTED" indicates that a fault has been detected with "1." "PROCESSED" indicates that a fault has been processed, i.e., a fault has been selected as one for which a test sequence will be generated and the step of generating a test sequence has been executed with "1." For example, it is shown in Table 1 that the step of generating a test sequence has been executed for the 0 stuck-at fault (s-a-0) of the signal line a, that the fault is not a redundant fault, accordingly, and that the fault has been detected by the external output pin. It is also shown in Table 1 that the step of generating a test sequence has been executed for the 0 stuck-at fault (s-a-0) of the signal line c, that the fault is not a redundant fault, accordingly, and that the generation of a test sequence has failed.

A reference numeral 17 designates a means for calculating a testability measure having a function of accepting the circuit table stored in the means 14 for storing a circuit table and calculating a testability measure of the whole sequential circuit in consideration of the operation of a sequential element.

A reference numeral 18 designates an element for calculating the sequential depth of a clock having a function of accepting the circuit table stored in the means 14 for storing a circuit table, tracing the sequential circuit from the clock input terminal of each flip-flop to its input side, and calculating the minimum number of flip-flops which will have been passed through until a given external input pin is reached. However, if a flip-flop is reached as a result of the tracing, only the input side from the clock input terminal of the flip-flop is traced. In other words, it has a function of calculating the sequential depth of a clock in the flip-flop.

A reference numeral 19 designates an element for identifying a flip-flop with a scan FF having a function of identifying flip-flops with scan FFs by the number stored in the means 15 for storing the specified number of scan FFs in the order of decreasing sequential depth of a clock, which was calculated by the element 18 for calculating the sequential depth of a clock, and a function of identifying flip-flops with scan FFs by the number stored in the means 15 for storing the specified number of scan FFs in the order of decreasing controllability of a clock input signal line, which was calculated by the element 17 for calculating a testability measure.

A reference numeral 20 designates an element for generating a test sequence having a function of generating a test sequence by regarding the output signal and input signal line of the flip-flop identified with a scan FF by the element 19 for identifying a flip-flop with a scan FF as an external input pin and external output pin, respectively.

A reference numeral 21 designates a report file indicating a fault coverage, a redundant fault, and the like.

The means 14 for storing a circuit table, means 15 for storing the specified number of scan FFs, and means 16 for storing a fault control table constitute a memory unit 22. On the other hand, the element 17 for calculating a testability measure, element 18 for calculating the sequential depth of a clock, element 19 for identifying a flip-flop with a scan FF, and element 20 for generating a test sequence constitute a processing unit 23. The operation of each of the element 17 for calculating a testability measure, element 18 for calculating the sequential depth of a clock, element 19 for identifying a flip-flop with a scan FF, and element 20 for generating a test sequence is controlled by a control unit (not shown).

Figure 6:
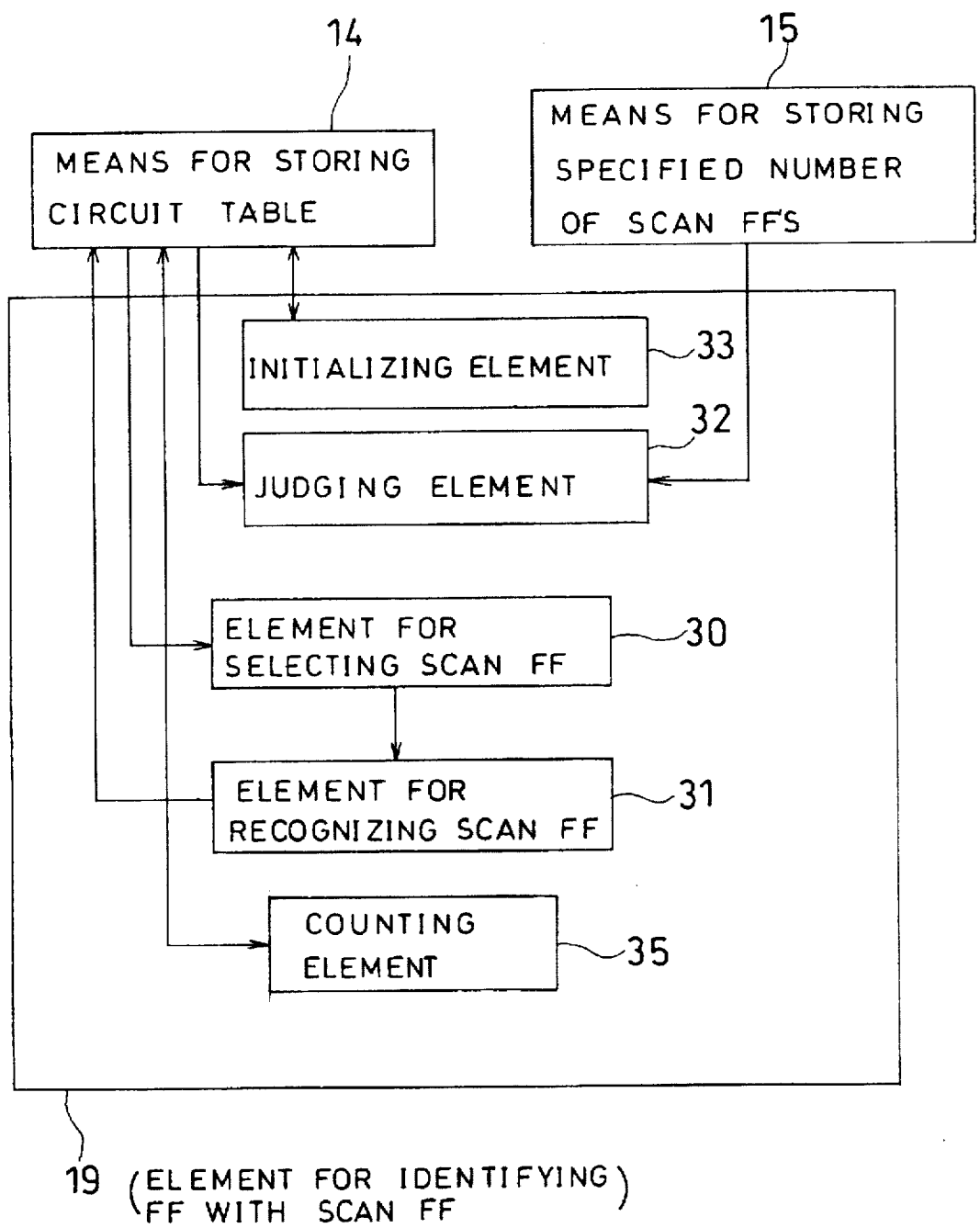
FIG. 6 is a block diagram showing the structure of an element for identifying a flip-flop with a scan FF of the apparatus for generating a test sequence shown in FIG. 5.

FIG. 6 is a block diagram showing the structure of the element 19 for identifying a flip-flop with a scan FF shown in FIG. 5.

In FIG. 6, an initializing element 33 initializes the scan FF number and a judging element 32 compares the scan FF number with the number stored in the means 15 for storing the specified number of scan FFs. An element 30 for selecting a scan FF selects a flip-flop having the largest sequential depth of a clock from the flip-flops included in the sequential circuit and identifies the selected flip-flop with a scan FF. Alternatively, the element 30 for selecting a scan FF selects a flip-flop having the largest controllability (0 controllability+1 controllability) of a clock input signal line from the flip-flops included in the sequential circuit and identifies the selected flip-flop with a scan FF. An element 31 for recognizing a scan FF recognizes the output signal line and input signal line of the flip-flop identified with a scan FF as an external input pin and external output pin, respectively. A counting element 35 increases the scan FF number by one. The judging element 32, element 30 for selecting a scan FF, element 31 for recognizing a scan FF, and counting element 35 are repeatedly operated until the can FF number reaches the number stored in the means 15 for storing the specified number of scan FFs. If the judging element 32 judges that the scan FF number is equal to the number stored in the scan FF number storage means 15 for storing the specified number of scan FFs, the element 19 for identifying a flip-flop with a scan FF is halted. In FIG. 6, a reference numeral 14 designates the means for storing a circuit table shown in FIG. 5.

Below, a description will be given to a specific example of the operation of the apparatus 10 for generating a test sequence shown in FIG. 5, i.e., to a case where the method of generating a test sequence according to the first and second embodiments is applied to a specific sequential circuit.

Table 2 shows the individual characteristics of the flip-flops included in a sequential circuit for which a test sequence will be generated.

TABLE 2

| CHARACTERISTICS OF FF'S | | | | |
|---|---|---|---|---|
| FF NUMBER | NUMBER OF LOOPS | CLOCK CIRCUIT | SEQUENTIAL DEPTH OF CLOCK | CONTROLLA- BILITY |
| FF1 | 3 | C.C.1 | 0 | 10 |
| FF2 | 2 | C.C.2 | 0 | 2 |
| FF3 | 0 | S.C.1 | 2 | 150 |
| FF4 | 1 | C.C.3 | 0 | 5 |
| FF5 | 0 | S.C.2 | 1 | 100 |

C.C.: COMBINATIONAL CIRCUIT
S.C.: SEQUENTIAL CIRCUIT

Figure 7A:
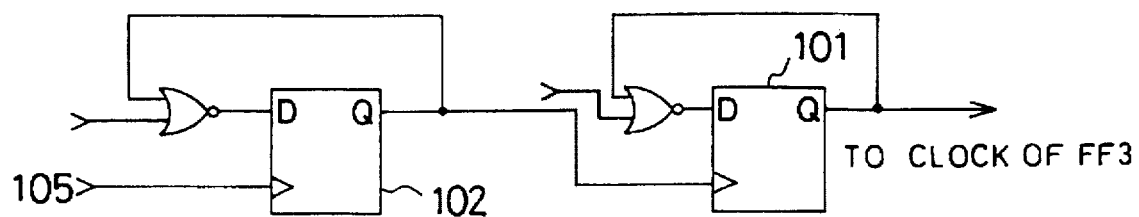
FIGS. 7(a) and 7(b) are circuit diagrams showing a clock circuit in a circuit under test to which the method of generating a test sequence according to the first and second embodiments is applied.
Figure 7B:
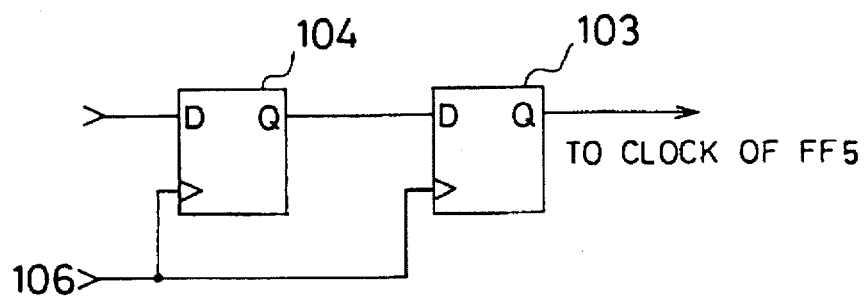

In Table 2, "FF NAME" indicates the name of a flip-flop, "NUMBER OF LOOPS" indicates the number of loops present in a sequential circuit for supplying signals to the data input terminal of a flip-flop, "CLOCK CIRCUIT" indicates a circuit for supplying a clock input signal to the clock input terminal so as to operate a flip-flop, "SEQUENTIAL DEPTH OF CLOCK" indicates the sequential depth of a clock in a flip-flop, and "CONTROLLABILITY" indicates the sum of 0 controllability and 1 controllability of a clock input signal line in a flip-flop. FIG. 7(a) indicates a clock circuit for FF3 shown in Table 2. FIG. 7(b) indicates a clock circuit for FF5. In FIGS. 7(a) and 7(b), reference numerals 101 to 104 designate D flip-flops and 105 and 106 designate external input pins.

A testability measure of the sequential circuit shown in Table 2 will be calculated by assuming that two flip-flops can be replaced with scan FFs. The result is that: the controllability of the clock input signal line of FF1 is 10; the controllability of the clock input signal line of FF2 is 2; the controllability of the clock input signal line of FF3 is 150; the controllability of the clock input signal line of FF4 is 5; and the controllability of the clock input signal line of FF5 is 100. The sequential depth of a clock in each flip-flop will be calculated. As a result, since each of the clock circuits for FF1, FF2, and FF4 is a combinational circuit, as shown in Table 2, the sequential depth of each of a clock is 0. The clock circuit for FF3 is a sequential circuit. If the input side from the clock input terminal of FF3 is traced, the D flip-flop 101 is reached first, as shown in FIG. 7(a). If the input side from the clock input terminal of the D flip-flop 101 is traced, the D flip-flop 102 is reached. If the input side from the clock input terminal of the D flip-flop 102 is traced, the external input pin 105 is reached. Thus, since the two D flip-flops 101 and 102 are passed through, the sequential depth of a clock for FF3 is 2. The clock circuit for FF5 is a sequential circuit. If the input side from the clock input terminal of FF5 is traced, the D flip-flop 103 is reached first, as shown in FIG. 7(b). If the input side from the clock input terminal of the D flip-flop 103 is traced, the external input pin 106 is reached. Thus, since the one D flip-flop 103 is passed through, the sequential depth of FF5 is 1.

Next, if flip-flops are identified with scan FFs in the order of decreasing sequential depth of a clock or in the order of decreasing controllability of a clock input signal line, FF3 and FF5 are identified with scan FFs in either case. A test sequence is then generated by regarding the output signal lines and input signal lines of FF3 and FF5 as external input pins and external output pins, respectively.

According to the conventional method of identifying a flip-flop with a scan FF, flip-flops are identified with scan FFs in the order of decreasing number of loops shown in Table 2, in such a manner as to cut off the loops, so that FF3 and FF5 cannot be identified with scan FFs. However, since the circuit under test is an asynchronous circuit as a whole and it is difficult to automatically generate rise signals to be supplied to the input terminals of FF3 and FF5, the fault coverage cannot be improved efficiently. With the method of identifying a flip-flop with a scan FF according to the present embodiment, however, the whole circuit under test becomes a complete synchronous circuit, so that the fault coverage is efficiently improved.

Thus, according to the first and second embodiments, if the circuit under test is an asynchronous circuit in which a clock circuit for supplying a clock input signal to the clock input terminal of a flip-flop is composed of a sequential circuit, flip-flops are replaced with scan FFs in the order of decreasing difficulty with which a rise signal (or a fall signal) to be supplied to the clock input terminal is automatically generated. Consequently, it becomes possible to generate a test sequence by regarding the circuit under test as a synchronous circuit, so that a test sequence which can provide a high fault coverage can be generated at a high speed.

(Third Embodiment)

Figure 8:
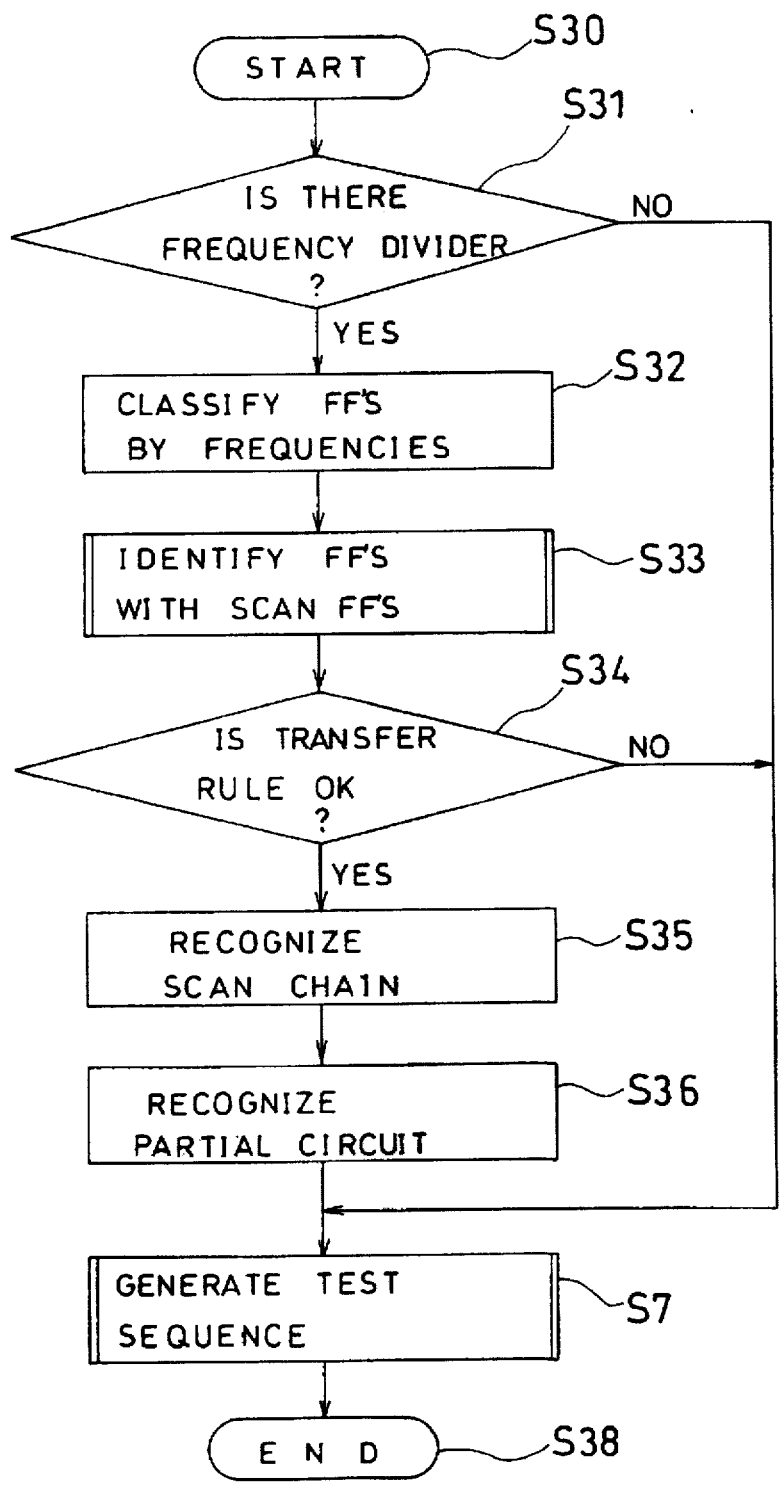
FIG. 8 is a flow chart showing the method of generating a test sequence according to a third embodiment of the present invention.

FIG. 8 is a flow chart showing the method of generating a test sequence for a sequential circuit according to a third embodiment of the present invention.

In FIG. 8, Step S30 designates the initiation of the step of generating a test sequence for a sequential circuit and Step S38 designates the completion of the step of generating a test sequence.

First, in Step S31, it is judged whether of not a frequency divider exists in a clock circuit for supplying a clock input signal to the clock input terminal of a flip-flop in the circuit under test. If the answer is YES, the process goes on to Step S32. If the answer is NO, the process goes on to Step S37.

In Step S32, flip-flops operated by individual clock input signals obtained from the same clock signal supplied to the same clock pin (external input pin) are classified by the frequencies of the clock input signals.

Next, in Step S33, flip-flops both on the sending side and receiving side, which are operated by the individual clock input signals with different frequencies obtained from the same clock signal supplied to the same clock pin and which transfer data therebetween, are identified with scan FFs.

Figure 9:
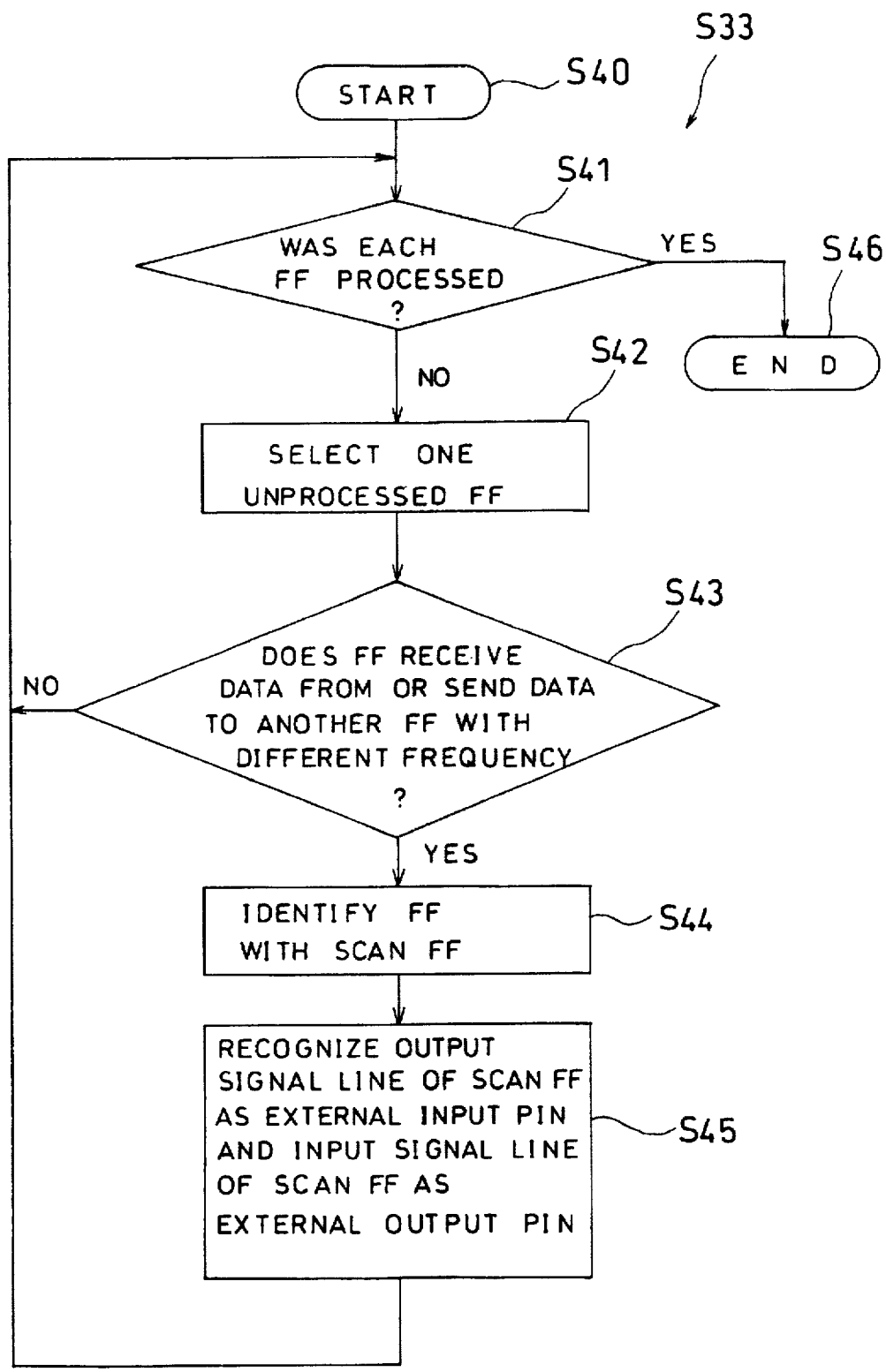
FIG. 9 is a flow chart showing in detail the step of identifying a flip-flop with a scan FF of the method of generating a test sequence according to the third embodiment.

FIG. 9 is a flow chart showing in detail the step of identifying flip-flops with scan FFs in Step S33. In FIG. 9, Step S40 designates the initiation of the step of identifying flip-flops with scan FFs and Step S46 designates the completion of the step of identifying flip-flops with scan FFs. First, in Step S41, it is judged whether or not it has been judged on each of the flip-flops included in the circuit under test (exclusive of the flip-flops present in the clock circuit) that it should or should not be replaced with scan FFs. If it is judged that there are flip-flops on which judgements have not yet been made, the process goes on to Step S42, where one flip-flop to be subjected to a judgment is selected from flip-flops on which it has not yet been judged whether or not they should be replaced with scan FFs. Next, in Step S43, it is judged whether or not the flip-flop selected in Step S42 receives data from or sends data to another flip-flop operated by a clock input signal with a different frequency obtained from the same clock signal supplied to the same clock pin. If the flip-flop receives data from or sends data to another flip-flop operated by a clock input signal with a different frequency obtained from the same clock signal supplied to the same clock pin, the process goes on to Step S44. Otherwise, the process returns to Step S41. In Step S44, the flip-flop on which it was judged in Step S43 that it received data from or sent data to another flip-flop operated by a clock input signal with a different frequency obtained from the same clock signal supplied to the same clock pin is identified with a scan FF. Next, in Step S45, the output signal line and input signal line of the flip-flop identified with a scan FF in Step S44 are recognized as an external input pin and external output pin, respectively. The process then returns to Step S41 and repeatedly execute Steps S41 to S45 thereafter. If it is judged in Step S41 that it has been judged on each of the flip-flops whether or not it should be replaced with scan FFs, the process goes on to Step S46, where the step of identifying flip-flops with scan FFs is completed.

If the step of identifying flip-flops with scan FFs of Step S33 is completed, it is judged in Step S34 whether or not data transfer between the flip-flops identified with scan FFs in Step S33 is unidirectional and whether or not the number of flip-flops on the sending side which send data is equal to or larger than the number of flip-flops on the receiving side which receive data. If the data transfer is unidirectional and if the number of flip-flops on the sending side is equal to or larger than the number of flip-flops on the receiving side, the process goes on to Step S35. Otherwise, the process goes on to Step S37.

In Step S35, it is recognized that the flip-flops identified with scan FFs in Step S33 are linked so as to constitute a scan chain. In this case, it is recognized that the flip-flops on the sending side are sequentially linked first and, after the linkage of all the flip-flops on the sending side is completed, the flip-flops on the receiving side are linked.

Next, in Step S36, a circuit part surrounded by the flip-flops on the sending side and on the receiving side, i.e., a circuit part for data transfer is recognized.

Next, in Step S37, a test sequence is generated by regarding the output signal line and input signal line of the flip-flop identified with a scan FF as an external input pin and external output pin, respectively.

Figure 10:
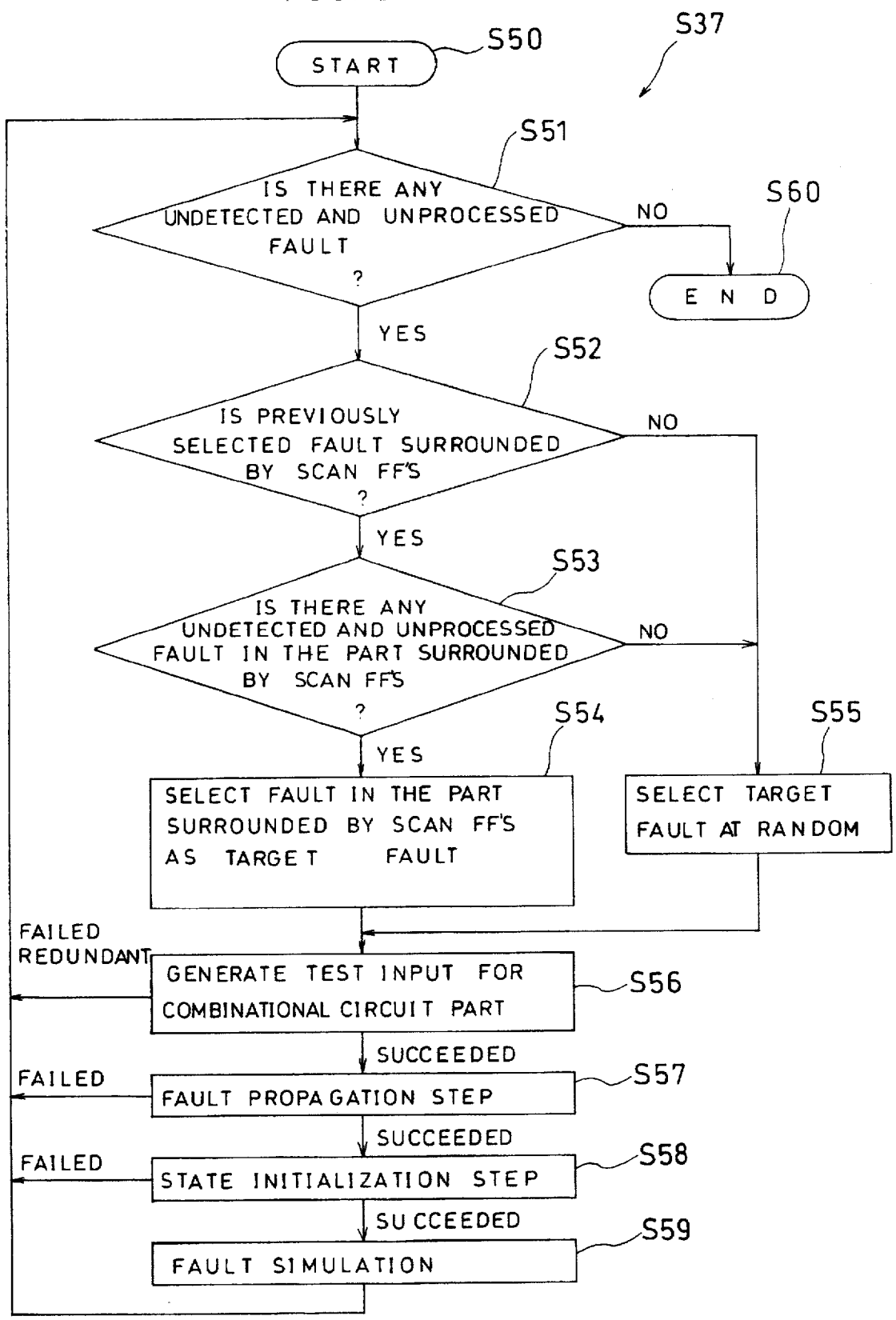
FIG. 10 is a flow chart showing in detail the step of generating a test sequence of the method of generating a test sequence according to the third embodiment.

FIG. 10 is a flow chart showing in detail the step of generating a test sequence of Step S37. In FIG. 10, Step S50 designates the initiation of the step of generating a test sequence and Step S60 designates the completion of the step of generating a test sequence. First, in Step S51, it is judged whether or not there is any undetected and unprocessed fault for which a test sequence has not yet been generated. If there is any undetected and unprocessed fault for which a test sequence has not yet been generated, the process goes on to Step S52, where it is judged whether or not the fault selected previously as an objective fault is a fault in the part surrounded by scan FFs. If the fault detected previously as an objective fault is a fault in the part surrounded by scan FFs, the process goes on to Step S53. Otherwise, the process goes on to Step S55. In Step S53, it is judged whether or not there is any undetected and unprocessed fault for which a test sequence has not yet been generated in the part surrounded by scan FFs. If there is any undetected and unprocessed fault for which a test sequence has not yet been generated, the process goes on to Step S54. If there is no such fault, the process goes on to Step S55.

In Step S54, one fault is selected as an objective fault from undetected and unprocessed faults in the part surrounded by scan FFs.

In Step S55, one fault is selected at random, as an objective fault, from undetected and unprocessed faults for which test sequences have not yet been generated, so that the process goes on to Step S56.

In Step S56, a test input is generated with respect to the objective fault exclusively for a combinational circuit part which has the external input pin of the sequential circuit and a pseudo external input (output of a sequential element) as its inputs and has the external output pin of the sequential circuit and a pseudo external output (input of a sequential element) as its output, so as to judge whether or not the generation of the test input has succeeded. If it has succeeded, it is further judged whether or not the objective fault is a redundant fault. If the generation of the test input has failed or if the objective fault is a redundant fault, the process returns to Step S51 so that another objective fault is processed. If the generation of the test input has succeeded and if the objective fault is not a redundant fault, on the other hand, the process goes on to Step S57.

In Step S57, a fault propagation step of generating a sequence for propagating the influence of the objective fault from the faulty part to a given external output pin is performed with respect to the objective fault, so as to judge whether or not the generation of the sequence has succeeded. If it has succeeded, the process goes on to Step S58. If it has failed, on the other hand, the process returns to Step S51 so that another objective fault is processed.

In Step S58, there is performed a state initialization step of generating a sequence for inducing the circuit to make a transition from the initial state to the state when the objective fault is activated, so as to judge whether or not the generation of the sequence has succeeded. If it has succeeded, the process goes on to Step S59. If it has failed, the process returns to Step S51 so that another objective fault is processed.

In Step S59, a fault simulation is executed using a test sequence for the objective fault, so that the fault detected by a given external output pin is deleted from undetected faults. After that, the process returns to Step S51 and repeatedly executes Steps S51 to S59. If it is judged in Step S51 that there is no undetected and unprocessed fault, the process goes on to Step S60, where the step of generating a test sequence is completed.

Figure 11:
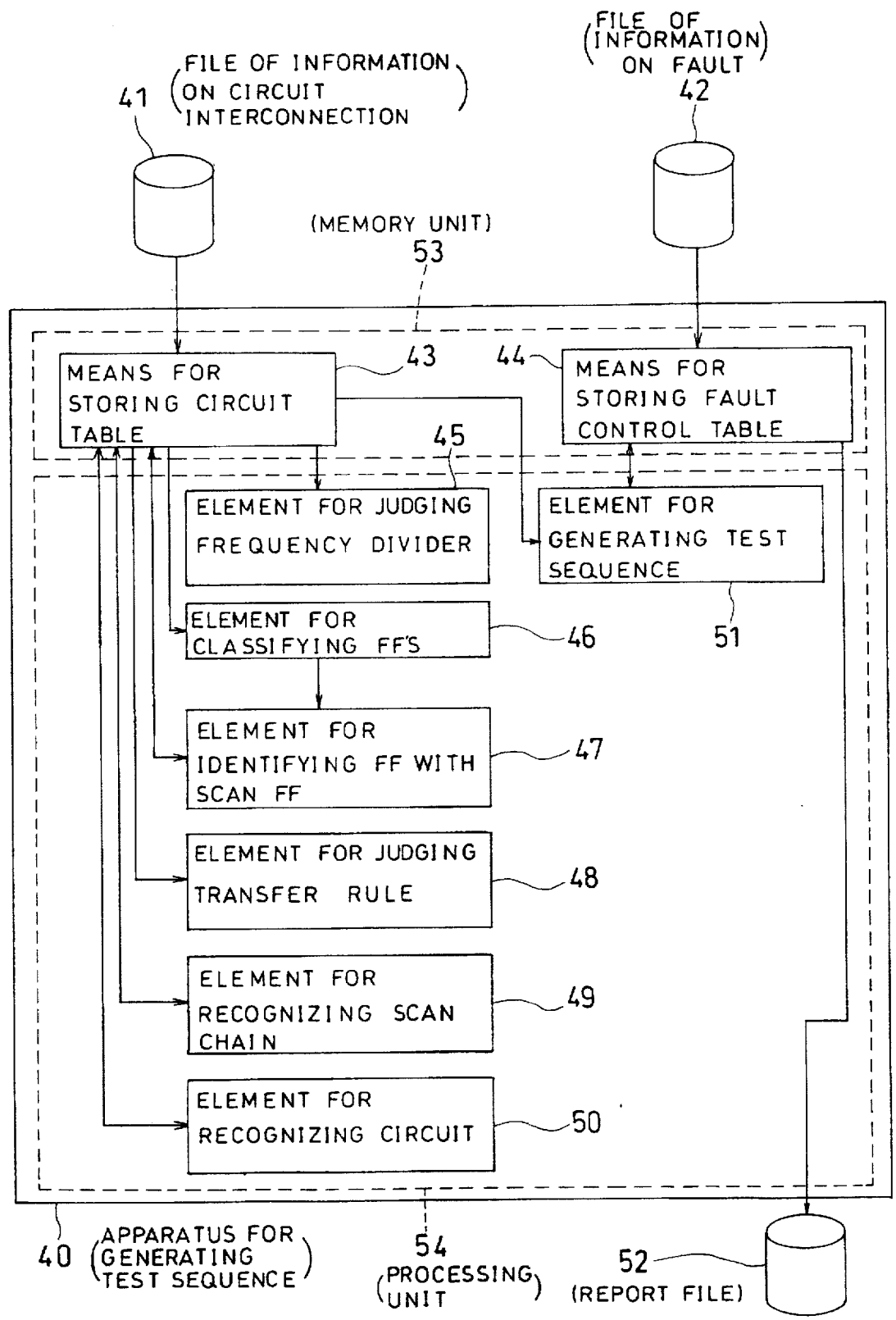
FIG. 11 is a block diagram showing the structure of the apparatus for generating a test sequence which implements the method of generating a test sequence according to the third embodiment.

FIG. 11 is a block diagram showing the structure of the apparatus for generating a test sequence for a sequential circuit, which implements the method of generating a test sequence according to the above third embodiment.

In FIG. 11, a reference numeral 40 designates the whole apparatus for generating a test sequence, 41 designates a file of information on circuit interconnection, and 42 designates a file of information on fault, in which faults are defined. The fault to be subjected to a test here is a stuck-at fault. A reference numeral 43 designates a means for storing a control table which reads in the file 41 of information on circuit interconnection as its input and stores a circuit table indicating information on the interconnection of a circuit, 44 designates a means for storing a fault control table which reads in the file 42 of information on fault and stores a fault control table, as shown in Table 1.

A reference numeral 45 designates an element for judging a frequency divider having a function of accepting the circuit table stored in the means 43 for storing a circuit table and judging whether or not a frequency divider exists in a clock circuit for supplying a clock input signal to the clock input terminal of a flip-flop in the circuit under test.

A reference numeral 46 designates an element for classifying FFs having a function of accepting the circuit table stored in the means 43 for storing a circuit table and classifying flip-flops operated by individual clock input signals obtained from the same clock signal supplied to the same clock pin (external input pin) by the frequencies of the clock input signals.

A reference numeral 47 designates an element for identifying a flip-flop with a scan FF having a function of identifying flip-flops both on the sending side and on the receiving side, which are operated by the clock input signals with different frequencies obtained from the same clock signal supplied to the same clock pin and which transfer data therebetween, with scan FFs.

A reference numeral 48 designates an element for judging a transfer rule having a function of judging whether or not data transfer between the flip-flops identified with scan FFs by the element for identifying a flip-flop with a scan FF 47 is unidirectional and whether or not the number of flip-flops on the sending side which send data is equal to or larger than the number of flip-flops on the receiving side which receive data.

A reference numeral 49 designates an element for recognizing a scan chain having a function of recognizing that a scan chain is constituted by linking the flip-flops identified with scan FFs by the element 47 for identifying a flip-flop with a scan FF. In this case, the element 49 for recognizing a scan chain recognizes that the flip-flops on the sending side are linked first and, after the linkage of all the flip-flops on the sending side is completed, the flip-flops on the receiving side are linked.

A reference numeral 50 designates an element for recognizing a circuit having a function of recognizing a circuit part surrounded by the flip-flops on the sending side and on the receiving side, i.e., a circuit part for data transfer.

A reference numeral 51 designates an element for generating a test sequence having a function of generating a test sequence by regarding the output signal line and input signal line identified with a scan FF by the element 47 for identifying a flip-flop with a scan FF as an external input pin and external output pin, respectively.

A reference numeral 52 designates a report file indicating a fault coverage, redundant fault, and the like.

The means 43 for storing a circuit table and means 44 for storing a fault control table constitute a memory unit 53. On the other hand, the element 45 for judging a frequency divider, element 46 for classifying flip-flops, element 47 for identifying a flip-flop with a scan FF, element 48 for judging a transfer rule, element 49 for recognizing a scan chain, element 50 for recognizing a circuit, and element 51 for generating a test sequence constitute a processing unit 54. The operation of each of the element 45 for judging a frequency divider, element 46 for classifying flip-flops, element 47 for identifying a flip-flop with a scan FF, element 48 for judging a transfer rule, element 49 for recognizing a scan chain, element 50 for recognizing a circuit, and element 51 for generating a test sequence is controlled by the control unit (not shown).

Figure 12:
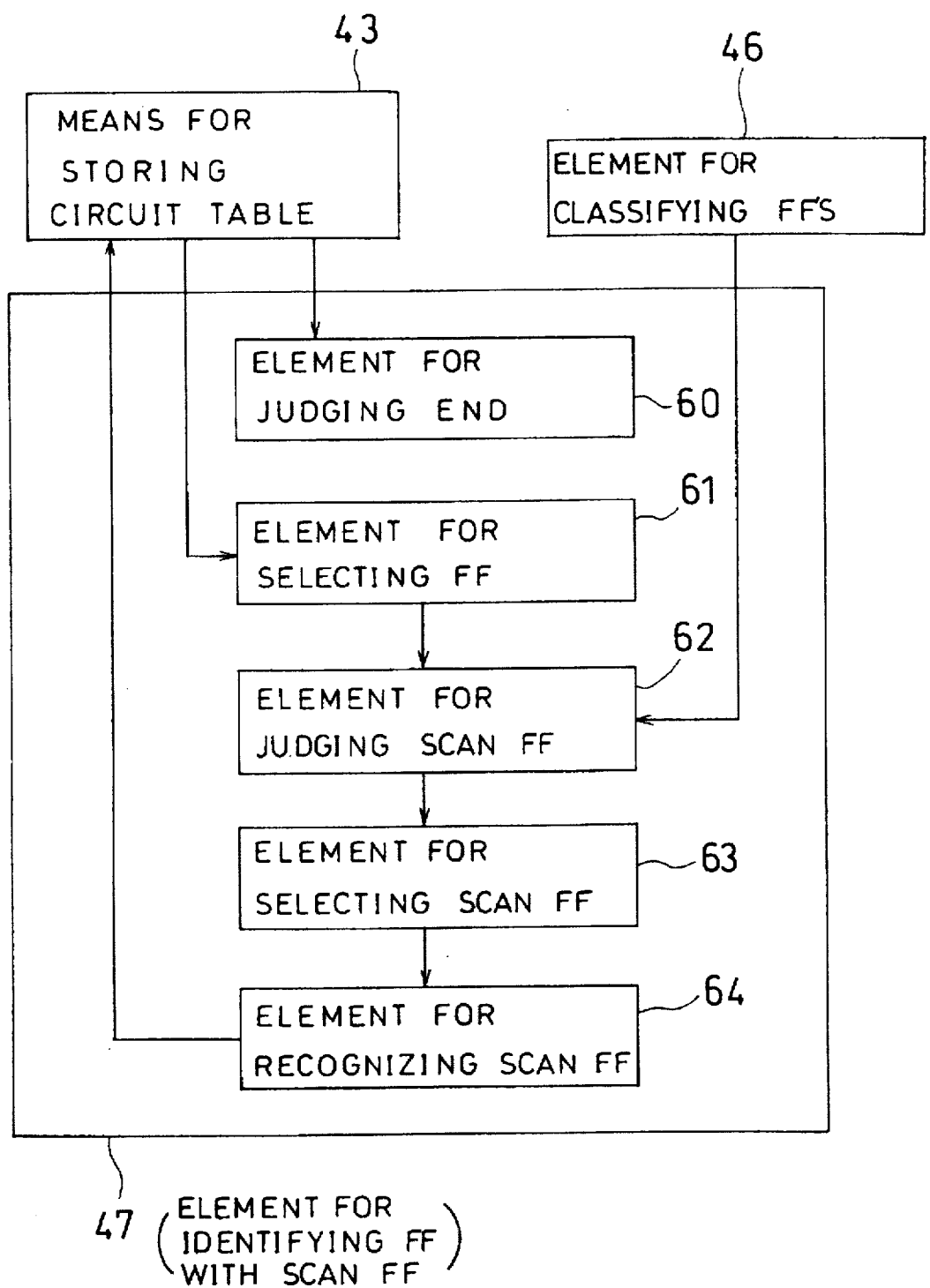
FIG. 12 is a block diagram showing the structure of the element for identifying a flip-flop with a scan FF of the apparatus for generating a test sequence shown in FIG. 11.

FIG. 12 is a block diagram showing the structure of the element 47 for identifying a flip-flop with a scan FF shown in FIG. 11.

In FIG. 12, a reference numeral 60 designates an element for judging an end having a function of judging, on each of the flip-flops included in the circuit under test (exclusive of the flip-flops in the clock circuit), whether or not it has been judged that it should or should not be replaced with a scan FF and 61 designates an element for selecting a flip-flop having a function of selecting one flip-flop from the flip-flops on which it has not yet been judged whether or not they should be replaced with scan FFs.

A reference numeral 62 designates an element for judging a scan FF having a function of judging whether or not the flip-flop selected by the element 61 for selecting a flip-flop receives data from or sends data to another flip-flop operated by a clock input signal with a different frequency obtained from the same clock signal supplied to the same clock pin.

A reference numeral 63 designates an element for selecting a scan FF having a function of identifying, if the flip-flop selected by the element 61 for selecting a flip-flop receives data from or sends data to another flip-flop operated by a clock input signal with a different frequency obtained from the same clock signal supplied to the same clock pin, the flip-flop with a scan FF.

A reference numeral 64 designates an element for recognizing a flip-flop having a function of recognizing the output signal line and input signal line of the flip-flop identified with a scan FF as an external input pin and external output pin, respectively.

Reference numerals 43 and 46 designate the means for storing a circuit table and the element for classifying flip-flops, respectively, each of which is shown in FIG. 11.

Figure 13:
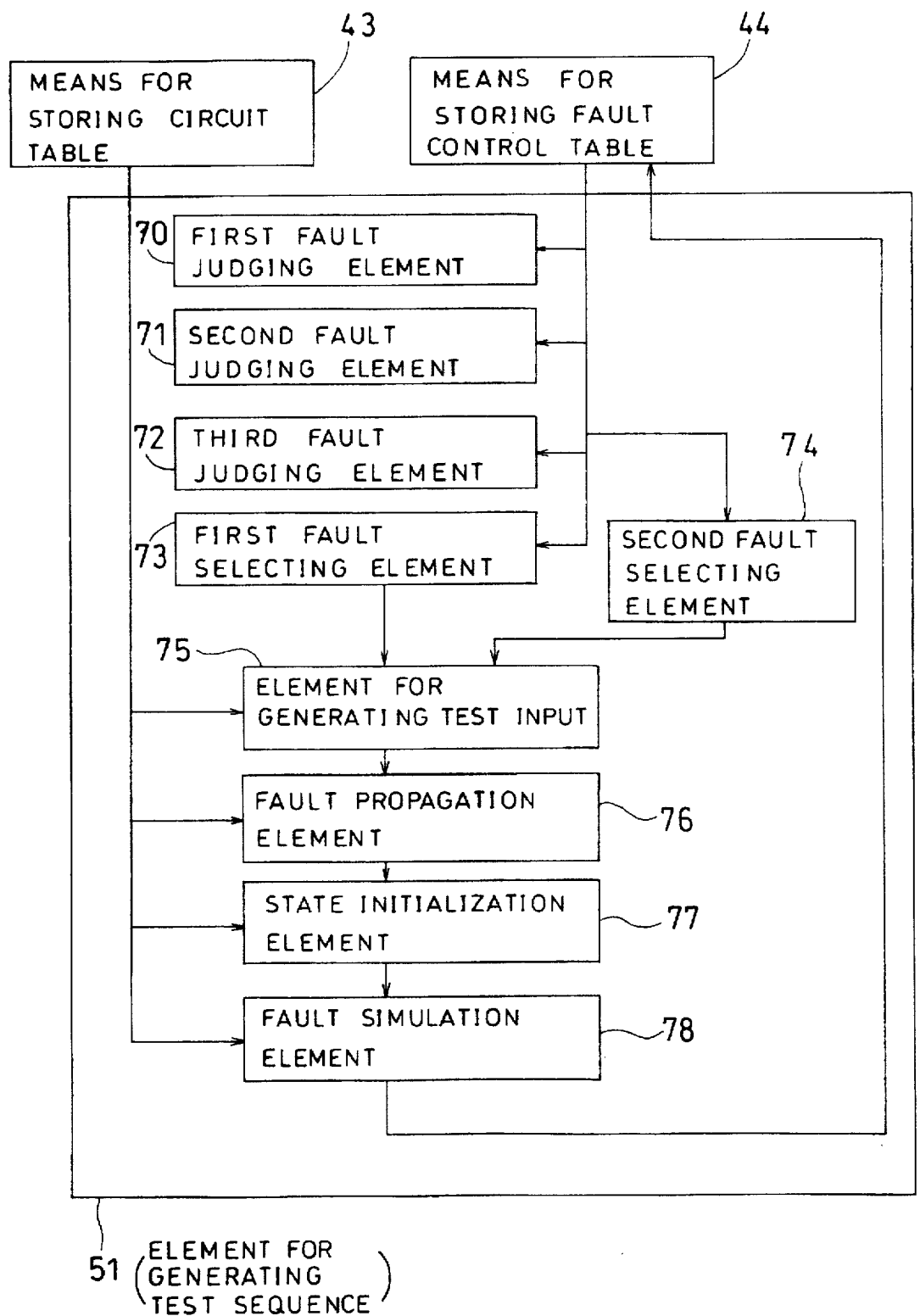
FIG. 13 is a block diagram showing the structure of an element for generating a test sequence of the apparatus for generating a test sequence shown in FIG. 11.

FIG. 13 is a block diagram showing the structure of the element 51 for generating a test sequence shown in FIG. 11. In FIG. 13, a reference numeral 70 designates a first fault judging element having a function of judging whether or not there is any undetected and unprocessed fault for which a test sequence has not yet been generated, 71 designates a second fault detecting element having a function of judging whether or not the fault previously detected as an objective fault is a fault in a part surrounded by scan FFs, 72 designates a third fault judging element having a function of judging whether or not there is any undetected and unprocessed fault for which a test sequence has not yet been generated in the part surrounded by scan FFs, and 73 designates a first fault selecting element having a function of selecting one fault, as an objective fault, from the undetected and unprocessed faults in the part surrounded by scan FFs.

A reference numeral 74 designates a second fault selecting element having a function of selecting one fault at random, as an objective fault, from the undetected and unprocessed faults for which test sequences have not yet been generated.

A reference numeral 75 designates an element for generating a test input having a function of generating a test input with respect to an objective fault exclusively for a combinational circuit part which has the external input pin of the sequential circuit and a pseudo external input (output of a sequential device) as its inputs and has the external output pin of the sequential circuit and a pseudo external output (input of a sequential device) as its outputs, judging whether or not the generation of the test input has succeeded, and further judging, if it has succeeded, whether or not the objective fault is a redundant fault.

A reference numeral 76 designates a fault propagation element having a function of performing a fault propagation step of generating a test sequence for propagating the influence of the objective fault from the faulty part to a given external output pin and judging whether or not the generation of the test sequence has succeeded.

A reference numeral 77 designates a state initialization element having a function of performing a state initialization step of generating a sequence for inducing the circuit to make a transition from the initial state to the state when the objective fault is activated and judging whether or not the generation of the sequence has succeeded.

A reference numeral 78 designates a fault simulation element having a function of performing a fault simulation using the test sequence for the objective fault and deleting the fault detected by a given external output pin from undetected faults.

Reference numerals 43 and 44 designate the means for storing a circuit table and means for storing a fault control table, respectively, each of which is shown in FIG. 11.

Below, a description will be given to a specific operation of the apparatus 40 for generating a test sequence shown in FIG. 11, i.e., to a case in which the method of generating a test sequence according to the third embodiment is applied to a specific sequential circuit.

Figure 14A:
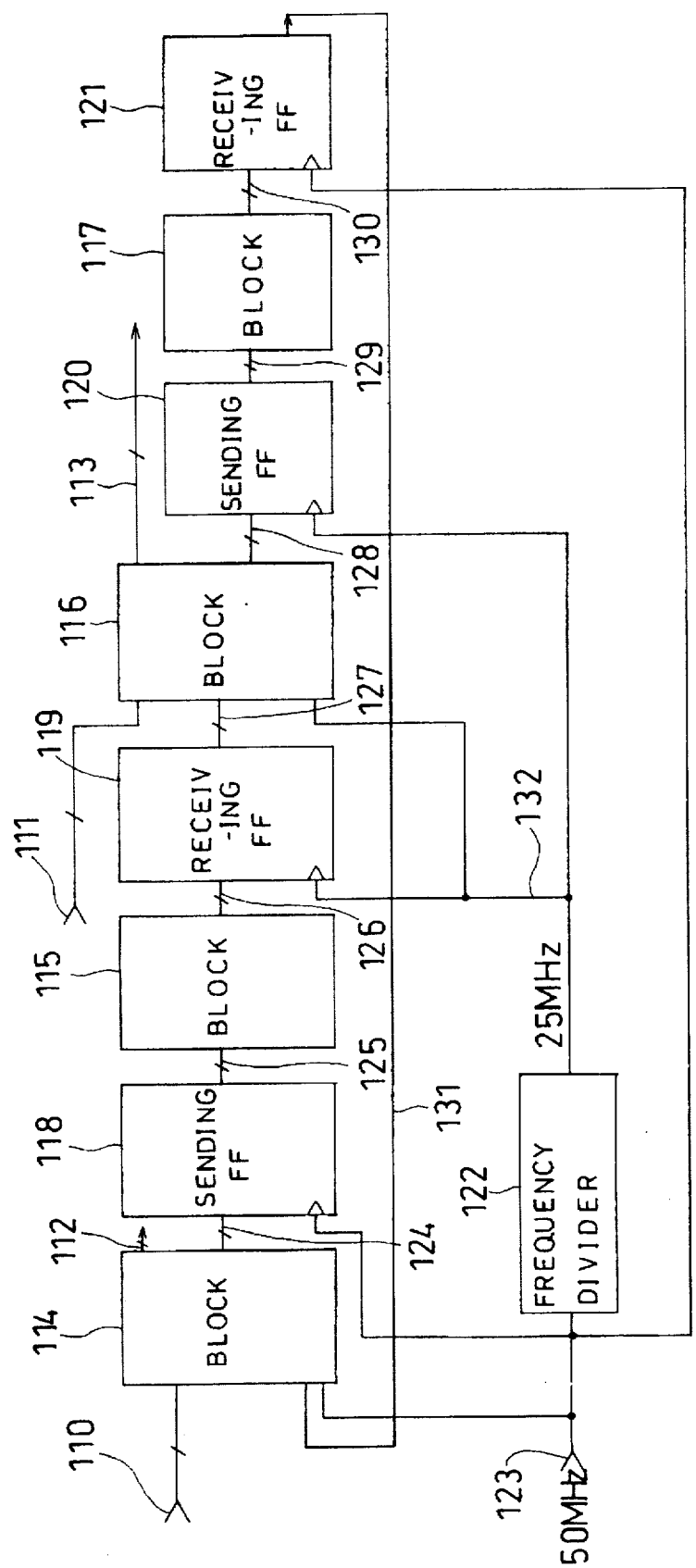
FIG. 14(a) is a block diagram showing an example of the circuit under test to which the apparatus for generating a test sequence according to the third embodiment is applied.

FIG. 14(a) shows an example of the sequential circuit for which a test sequence will be generated. FIG. 14(b) shows a circuit for which a test sequence will be generated after flip-flops, which are operated by clock input signals with different frequencies obtained from the same clock signal supplied to the same clock pin and which perform data transmission therebetween, are identified with scan FFs in the sequential circuit of FIG. 14(a).

In FIGS. 14(a) and 14(b), reference numerals 110 and 111 designate external input pins and 112 and 113 designate external output pins. A reference numeral 114 designates a sequential circuit block which has the external pin 110, a clock pin 123, and a group 131 of signal lines as its inputs and the external output pin 112 and a group 124 of signal lines as its outputs. A reference numeral 115 designates a combinational circuit block which has a group 125 of signal lines as its inputs and has a group 126 of signal lines as its outputs. A reference numeral 116 designates a sequential circuit block which has the external input pin 11, a group of signal lines 127, and the output signal line 132 of the frequency divider 122 as its inputs and has the external output pin 113 and a group 128 of signal lines as its outputs. A reference numeral 117 designates a combinational circuit block which has a group of signal lines 129 as its inputs and has a group of signal lines 130 as its outputs. Reference numerals 118 and 121 designate groups of flip-flops, in which each flip-flop is operated by a clock signal of 50 MHz supplied to the clock pin 123. Reference numerals 119 and 120 designate groups of flip-flops, in which each flip-flop is operated by a clock signal of 25 MHz obtained from the clock signal of 50 MHz supplied to the clock pin 123, the frequency of which has been divided by the frequency divider 122. A reference numeral 122 designates a frequency divider for dividing the frequency of the clock signal of 50 MHz supplied to the clock pin 123 and outputting the clock signal of 25 MHz to the output signal line 132. A reference numeral 123 designates a clock pin (external input pin), 124 designates a group of signal lines to be input to the group of flip-flops 118, 125 designates a group of signal lines output from the group of flip-flops 118, 126 designates a group of signal lines to be input to the group of flip-flops 119, 127 designates a group of signal lines output from the group of flip-flops 119, 128 designates a group of signal lines to be input to the group of flip-flops 120, 129 designates a group of signal lines output from the group of flip-flops 120, 130 designates a group of signal lines to be input to the group of flip-flops 121,131 designates a group of signal lines output from the group of flip-flops 121, and 132 designates the output signal line of the frequency divider 122.

In the sequential circuit for which a test sequence will be generated, there exists the frequency divider 122, as shown in FIG. 14(a). Consequently, the flip-flops operated by the clock input signals of 50 MHz and 25 MHz obtained from the same clock signal (50 MHz) supplied to the same clock pin 123 are classified by the frequencies of the clock input signals. As a result, the flip-flops can be classified into the two types of: the groups of flip-flops 118 and 121 and group of flip-flops present in the sequential circuit block 114, which are operated by the clock input signal of 50 MHz; and the groups of flip-flops 119 and 120 and group of flip-flops present in the sequential circuit block 116, which are operated by the clock input signal of 25 MHz.

Next, each flip-flop in the groups of flip-flops 118 and 119, which are operated by the individual clock input signals with different frequencies and which transmit data therebetween and, each flip-flop in the groups of flip-flops 120 and 121 are identified with scan FFs.

After the identification of flip-flops with scan FFs, the generation of a test sequence in relation to a fault present in the block 114 can be performed with respect to a complete synchronous circuit having 110,131,123 as external inputs and having 112 and 124 as external outputs. Similarly, the generation of a test sequence in relation to a fault present in the block 115 can be performed with respect to a combinational circuit having 125 as an external input and 126 as an external output. The generation of a test sequence in relation to a fault present in the block 116 is performed with respect to an asynchronous circuit having 111,127, and 123 as external inputs and having 113 and 128 as external outputs. Since the block 116 is a complete synchronous circuit except for the frequency divider 122, if a rise signal (or a fall signal) to be supplied to the signal line 132 can be automatically generated, the generation of a test sequence as a complete synchronous circuit can be performed. The generation of a test sequence in relation to a fault present in the block 117 can be performed with respect to a combinational circuit having 129 as an external input and 130 as an external output.

Figure 15A:
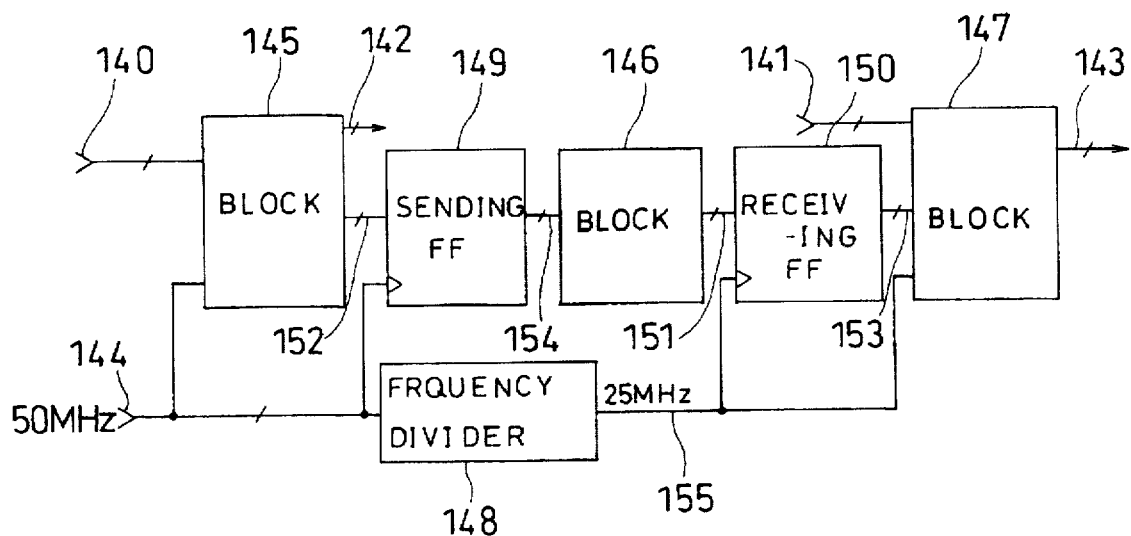
FIG. 15(a) is a block diagram showing another example of the circuit under test to which the method of generating a test sequence according to the third embodiment is applied.
Figure 15B:
FIG. 15(b) is a view showing flip-flops on the sending side to be identified with scan FFs in the circuit under test of FIG. 15(a)
Figure 15C:
FIG 15(c) is a view showing flip-flops on the receiving side to be replaced with scan FFs in the circuit under test of FIG. 15(a)
Figure 15D:
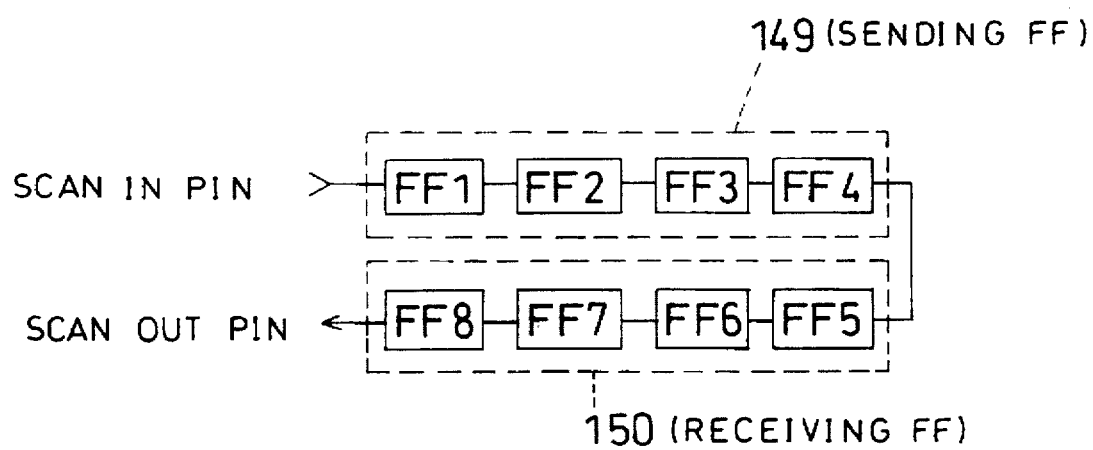
FIG. 15(d) is a view showing a scan chain constituted by the flip-flops shown in FIGS. 15(b) and 15(c)
Figure 15E:
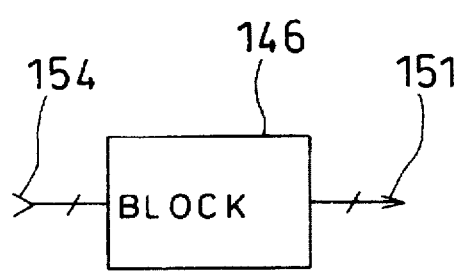
FIG. 15(e) is a view showing a combinational circuit block surrounded by the scan chain of FIG. 15(d) in the circuit under test of FIG. 15(a).

FIG. 15(a) shows another example of the sequential circuit for which a test sequence will be generated. FIG. 15(b) shows flip-flops on the sending side among flip-flops which are operated by clock input signals with different frequencies obtained from the same clock signal supplied to the same clock pin, which perform data transmission therebetween, and which are identified with scan FFs. FIG. 15(c) designates flip-flops on the receiving side. FIG. 15(d) designates a scan chain which was obtained by sequentially linking the flip-flops on the sending side identified with scan FFs and, after the linkage of all the flip-flops on the sending side is completed, linking flip-flops on the receiving side. FIG. 15(e) shows a combinational circuit block surrounded by the scan chain of FIG. 15(d).

In FIGS. 15(a) to 15(e), reference numerals 140 and 141 designates external input pins and 142 and 143 designate external output pins. A reference numeral 144 designates a clock pin (external input pin), 145 designates a sequential circuit block having the external output pin 140 and clock pint 144 as its inputs and having the external output pin 142 and a group 152 of signal lines as its outputs, 146 designates a combinational circuit block having a group 154 of signal lines as its inputs and having a group 151 of signal lines as its outputs, 147 designates a sequential circuit block having the external input pin 141, a group 153 of signal lines, and the output line 155 of the frequency divider 148 as its inputs and having the external output pin 143 as its output, 148 designates a frequency divider for dividing the frequency of the clock signal of 50 MHz supplied to the clock pin 144 and outputting the clock signal of 25 MHz to the output signal line 155, 149 designates a group of flip-flops, in which flip-flops FF1 to FF4 are operated by the clock signal of 50 MHz supplied to the clock pin 144, 150 designates a group of flip-flops, in which flip-flops FF5 to FF8 are operated by the clock signal of 25 MHz obtained from the clock signal of 50 MHz, the frequency of which has been divided by the frequency divider 148, 151 designates a group of signal lines to be input to the group 150 of flip-flops, 152 designates a group of signal lines to be input to the group 149 of flip-flops, 153 designates a group of signal lines output from the group 150 of flip-flops, 154 designates a group of signal lines output from the group 149 of flip-flops, and 155 designates the output signal line of the frequency divider 148.

In the sequential circuit for which a test sequence will be generated, a frequency divider 148 exists, as shown in FIG. 15(a). Consequently, flip-flops which are operated by the individual input signals of 50 MHz and 25 MHz obtained from the same clock signal (50 MHz) supplied to the same clock pin 144 are classified by the frequencies of the clock input signals. As a result, the flip-flops are classified into two types of: the group 149 of flip-flops and group of flip-flops present in the sequential circuit block 145 which are operated by the clock input signal of 50 MHz; and the group 150 of flip-flops and group of flip-flops present in the sequential circuit block 147 which are operated by the clock input signal of 25 MHz.

Next, the flip-flops FF1 to FF8 (see FIGS. 15(b) and 15(c)) in the groups 149 and 150 of flip-flops, which are operated by the clock input signals with the different frequencies and which transmit data therebetween, are identified with scan FFs.

Here, the data transfer between the flip-flops identified with scan FFs is unidirectional, and the number of the flip-flops on the sending side which transfer data is equal to the number of the flip-flops on the receiving side which receive data (four flip-flops in each side).

Consequently, as shown in FIG. 15(d), it is recognized that the scan chain is constituted by linking the flip-flops FF1 to FF4 on the sending side first and then linking the flip-flops FF5 to FF8 on the receiving side. Next, the combinational circuit block 146 is recognized as a circuit part surrounded by the scan chain.

Thus, in the case of generating a test sequence after identifying flip-flops with scan FFs, recognizing the scan chain, and recognizing the circuit part surrounded by the scan chains, the generation of a test sequence in relation to a fault present in the combinational circuit block 146 can be performed with respect to the combinational circuit having 154 as an external input and 151 as its external output by sequentially selecting faults in the part surrounded by the scan chain, as shown in FIG. 15(e). Moreover, it is not necessary to input a test pattern for eight (the number of the flip-flops in the scan chain) clocks in order to scan in or scan out.

Thus, according to the third embodiment, with a circuit under test for which it is difficult to generate a test sequence, e.g., a circuit in which flip-flops are operated by individual clock input signals with different frequencies obtained from the same clock signal supplied to the same clock pin and they transfer data therebetween, the above flip-flops are replaced with scan FFs. As a result, the circuit under test is divided into a combinational circuit, complete synchronous circuit, and synchronous circuit so that an independent test sequence can be generated for each circuit. Consequently, test sequences which provide a high fault coverage can be generated at a high speed with increased ease.

If the data transfer is unidirectional, the operations of scanning in and scanning out can be performed with a shorter test pattern by recognizing that the scan chain is constituted by linking the flip-flops on the sending side first and then linking the flip-flops on the receiving side. In the case of selecting an objective fault for performing the generation of a test sequence, faults in the circuit part surrounded by scan FFs are sequentially selected, thereby performing the generation of a test sequence at an extremely high speed.

We claim:

1. A method of generating a test sequence for testing a stuck-at fault supposed in a sequential circuit as a circuit under test, comprising:
    a first step of specifying, among registers included in said circuit under test, the number of registers which can be replaced with scan registers;
    a second step of calculating the controllability of a clock input signal line for each of the registers included in said circuit under test, said controllability of a clock input signal line being defined as cost required for setting a desired value to a signal line connected to the clock input terminal of said register; and
    a third step of identifying registers with scan registers by the number specified in said first step in the order of decreasing controllability of a clock input signal line calculated in said second step.

2. A method of generating a test sequence according to claim 1, wherein said third step has:
    a fourth step of selecting, among the registers included in said circuit under test, a register having the largest controllability of a clock input signal line calculated in said second step and identifying the selected register with a scan register;
    a fifth step of recognizing the output signal line and input signal line of the register identified with a scan register in said fourth step as an external input pin and external output pin, respectively,
    said fourth and fifth steps being repeatedly performed so that another register can be selected in said fourth step from the registers included in the circuit under test, exclusive of the register identified with a scan register, until the number of registers identified with scan registers reaches the number specified in said first step.

3. A method of generating a test sequence for testing a stuck-at fault supposed in a sequential circuit as a circuit under test, comprising:
    a first step of judging whether or not a frequency divider exists in said circuit under test;
    a second step of classifying, if it is judged in said first step that a frequency divider exists in said circuit under test, the registers included in said circuit under test by the frequencies of clock input signals for operating the individual registers: and
    a third step of identifying registers, which are operated by the individual clock input signals with different frequencies and which transfer data therebetween, with scan registers.

4. A method of generating a test sequence according to claim 3, wherein said third step has:
    a fourth step of judging whether or not it has been judged on each of the registers included in said circuit under test that it should or should not be replaced with a scan register:
    a fifth step of selecting, if it is judged in said fourth step that there are registers on which it has not yet been judged whether or not they should be replaced with scan registers, a register on which it will be judged whether or not it should be replaced with a scan register from the registers on which judgments have not yet been made;
    a sixth step of judging whether or not the register selected in said fifth step receives data from or sends data to another register operated by the clock input signal with a different frequency:
    a seventh step of identifying, if it is judged in said sixth step that said register receives data from or sends data to another register operated by the clock input signal with a different frequency, said register with a scan register: and
    an eighth step of recognizing the output signal line and input signal line of the register identified with a scan register in said seventh step as an external input pin and external output pin.

5. A method of generating a test sequence according to claim 4, further comprising:
    a ninth step of judging whether or not each of the registers identified with scan registers in said third step performs either the receiving of data from or sending of data to another register operated by the clock input signal with a different frequency and whether or not the number of registers on the sending side which send data to another register operated by the clock input signal with a different frequency is equal to or larger than the number of registers on the receiving side which receive data from another register operated by the clock input signal with a different frequency;
    a tenth step of recognizing, if it is judged in said ninth step that each register performs either said receiving of data or said sending of data and that the number of said registers on the sending side is equal to or larger than the number of said registers on the receiving side, a scan chain which is obtained by sequentially linking the registers on the sending side first and, after the linkage of all the registers on the sending side is completed, liking the registers on the receiving side;
    an eleventh step of recognizing, in said circuit under test, a circuit part surrounded by the registers on the sending side and by the registers on the receiving side;

a twelfth step of judging whether or not an objective fault is a fault in the circuit part recognized in said eleventh step;

a thirteenth step of judging, if it is judged in said twelfth step that the objective fault is a fault in said circuit part, whether or not there are undetected and unprocessed faults for which test sequences have not yet been generated in said circuit part; and a fourteenth step of selecting, if it is judged in said thirteenth step that there are undetected and unprocessed faults in said circuit part, another objective fault from the undetected and unprocessed faults in said circuit part.

6. A method of generating a test sequence according to claim 4, further comprising:

a fourth step of judging whether or not each of the registers identified with scan registers in said third step performs either the receiving of data from or sending of data to another register operated by the clock input signal with a different frequency and whether or not the number of registers on the sending side which send data to another register operated by the clock input signal with a different frequency is equal to or larger than the number of registers on the receiving side which receive data from another register operated by the clock input signal with a different frequency;

a fifth step of recognizing, if it is judged in said fourth step that each register performs either said receiving of data or said sending of data and that the number of said registers on the sending side is equal to or larger than the number of said registers on the receiving side, a scan chain which is obtained by sequentially linking the registers on the sending side first and, after the linkage of all the registers on the sending side is completed, linking the registers on the receiving side;

a sixth step of recognizing, in said circuit under test, a circuit part surrounded by the registers on the sending side and by the registers on the receiving side;

a seventh step of judging whether or not an objective fault is a fault in the circuit part recognized in said sixth step;

an eighth step of judging, if it is judged in said seventh step that the objective fault is a fault in said circuit part, whether or not there are undetected and unprocessed faults for which test sequences have not yet been generated in said circuit part; and a ninth step of selecting, if it is judged in said eighth step that there are undetected and unprocessed faults in said circuit part, another objective fault from the undetected and unprocessed faults in said circuit part.

7. An apparatus for generating a test sequence for testing a stuck-at fault supposed in a sequential circuit as a circuit under test, comprising:

a first means for storing the number of registers which can be replaced with scan registers among the registers included in said circuit under test;

a second means for calculating the controllability of a clock input signal line for each of the registers included in said circuit under test, said controllability of a clock input signal line being defined as cost required for setting a specified value to a signal line connected to the clock input terminal of the register;

a third means for selecting, from the registers included in said circuit under test, a register having the largest controllability of a clock input signal line calculated by said second means identifying said register with a scan register; and a fourth means for recognizing the output signal line and input signal line of said register identified with a scan register by said third means as an external input pin and external output pin, respectively, said third and fourth means being repeatedly operated so that another register can be selected by said third means from the registers included in the circuit under test, exclusive of the register identified with a scan register by said third means, until the number of the registers identified with scan registers reaches the number stored by said first means.

8. An apparatus for generating a test sequence for testing a stuck-at fault supposed in a sequential circuit as a circuit under test, comprising:

a first means for judging whether or not a frequency divider exists in said circuit under test;

a second means for classifying, if it is judged that a frequency divider exists in said circuit under test, the registers included in said circuit under test by the frequencies of clock input signals for operating the individual registers;

a third means for judging whether or not it has been judged on each of the registers included in said circuit under test that it should or should not be replaced with a scan register;

a fourth means for selecting, if it is judged by said third means that there are registers on which it has not yet been judged whether or not they should be replaced with scan registers, a register on which it will be judged that it should or should not be replaced with a scan register from the registers on which judgements have not yet been made;

a fifth means for judging whether or not the register selected by said fourth means receives data from or sends data to another register operated by the clock input signal with a different frequency;

a sixth means for identifying, if it is judged that said register receives data from or sends data to another register operated by the clock input signal with a different frequency, said register with a scan register; and a seventh means for recognizing the output signal line and input signal line of the register identified with a scan register as an external input pin and external output pin, respectively.

9. An apparatus for generating a test sequence according to claim 8, further comprising:

an eighth means for judging, whether or not each of the registers identified with scan registers by said sixth means performs either the receiving of data from or sending of data to another register operated by the clock input signal with a different frequency and whether or not the number of the registers on the sending side which send data to another register operated by the clock input signal with a different frequency is equal to or larger than the number of the registers on the receiving side which receive data from another register operated by the clock input signal with a different frequency;

a ninth means for recognizing, if it is judged by said eighth means that each register performs either said receiving of data or said sending of data and that the number of the registers on the sending side which send data to another register operated by the clock input signal with a different frequency is equal to or larger than the registers on the receiving side which receive data to another register operated by the clock input signal with a different frequency, a scan chain which is obtained by sequentially linking the registers on the sending side first and, after the linkage of all the registers on the sending side is completed, linking the registers on the receiving side;

a tenth means for recognizing, in said circuit under test, a circuit part surrounded by said registers on the sending side and by the registers on the receiving side:

an eleventh means for judging whether or not an objective fault is a fault in the circuit part recognized by said tenth means;

a twelfth means for judging, if it is judged by said eleventh means that the objective fault is a fault in said circuit part, whether or not there are undetected and unprocessed faults for which test sequences have not yet been generated; and a thirteenth means for selecting, if it is judged by said twelfth means that there are undetected and unprocessed faults in said circuit part, another objective fault from the undetected and unprocessed faults in said circuit part.

* * * * *

UNITED STATES PATENT AND TRADEMARK OFFICE
CERTIFICATE OF CORRECTION

PATENT NO. : 5,737,341
DATED : April 7, 1998
INVENTOR : Hosokawa

It is certified that error appears in the above-identified patent and that said Letter Patent is hereby corrected as shown below:

Claim 6, line 2, delete "4" and insert --3--.

Signed and Sealed this

Fourteenth Day of March, 2000

*Attest:*

Q. TODD DICKINSON

*Attesting Officer*    *Commissioner of Patents and Trademarks*